(12) United States Patent
Madsen et al.

(10) Patent No.: US 12,379,669 B2
(45) Date of Patent: Aug. 5, 2025

(54) MASSIVE OVERLAY METROLOGY SAMPLING WITH MULTIPLE MEASUREMENT COLUMNS

(71) Applicant: KLA Corporation, Milpitas, CA (US)

(72) Inventors: Jonathan Madsen, Los Altos, CA (US); Andrei V. Shchegrov, Campbell, CA (US); Amnon Manassen, Haifa (IL); Andrew V. Hill, Sunriver, OR (US); Yossi Simon, Qiryat Atta (IL); Gilad Laredo, Haifa (IL); Yoram Uziel, Migdal Ha'emek (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/376,703

(22) Filed: Oct. 4, 2023

(65) Prior Publication Data

US 2024/0027919 A1 Jan. 25, 2024

Related U.S. Application Data

(63) Continuation of application No. 17/210,793, filed on Mar. 24, 2021, now Pat. No. 11,899,375.

(Continued)

(51) Int. Cl.
*G03F 7/00* (2006.01)
*G03F 9/00* (2006.01)
(Continued)

(52) U.S. Cl.
CPC ...... *G03F 7/70633* (2013.01); *G03F 7/70653* (2023.05); *G03F 7/706843* (2023.05);
(Continued)

(58) Field of Classification Search
CPC ............ G03F 7/70605; G03F 7/70608; G03F 7/70616; G03F 7/70625; G03F 7/70633;
(Continued)

(56) References Cited

U.S. PATENT DOCUMENTS 4,390,789 A 6/1983 Smith et al.
4,595,289 A * 6/1986 Feldman ............. G03F 7/70483
356/392

(Continued)

FOREIGN PATENT DOCUMENTS

CN 105980908 A 9/2016
CN 111678902 A 9/2020
(Continued)

OTHER PUBLICATIONS

U.S. Appl. No. 17/142,783, filed Jan. 6, 2021, Hill et al.
(Continued)

*Primary Examiner* — Gordon J Stock, Jr.
(74) *Attorney, Agent, or Firm* — Suiter Swantz IP

(57) ABSTRACT

A multi-column metrology tool may include two or more measurement columns distributed along a column direction, where the two or more measurement columns simultaneously probe two or more measurement regions on a sample including metrology targets. A measurement column may include an illumination sub-system to direct illumination to the sample, a collection sub-system including a collection lens to collect measurement signals from the sample and direct it to one or more detectors, and a column-positioning sub-system to adjust a position of the collection lens. A measurement region of a measurement column may be defined by a field of view of the collection lens and a range of the positioning system in the lateral plane. The tool may further include a sample-positioning sub-system to scan the sample along a scan path different than the column direction to position metrology targets within the measurement regions of the measurement columns for measurements.

33 Claims, 16 Drawing Sheets

Related U.S. Application Data

(60) Provisional application No. 63/116,163, filed on Nov. 20, 2020.

(51) Int. Cl.
*H01J 37/304* (2006.01)
*H01J 37/317* (2006.01)

(52) U.S. Cl.
CPC ...... *G03F 7/706845* (2023.05); *G03F 9/7084* (2013.01); *H01J 37/3045* (2013.01); *H01J 37/3177* (2013.01); *H01J 2237/31764* (2013.01)

(58) Field of Classification Search
CPC .............. G03F 7/70641; G03F 7/7065; G03F 7/70653; G03F 7/70655; G03F 7/70666; G03F 7/70675; G03F 7/70681; G03F 7/70683; G03F 7/706831; G03F 7/706833; G03F 7/706835; G03F 7/706837; G03F 7/706839; G03F 7/706841; G03F 7/706843; G03F 7/706845; G03F 7/706847; G03F 7/706849; G03F 7/706851; G03F 9/7084; H01J 2237/31764; H01J 37/3045; H01J 37/3177; G01N 21/95684; G01N 21/8806; G01N 21/8851

See application file for complete search history.

(56) References Cited

U.S. PATENT DOCUMENTS

| | | | |
|---|---|---|---|
| 4,661,709 A | 4/1987 | Walker et al. | |
| 4,694,178 A | 9/1987 | Harte | |
| 5,455,673 A | 10/1995 | Alsmeyer et al. | |
| 5,463,459 A * | 10/1995 | Morioka | H01L 21/67253 257/E21.53 |
| 5,644,393 A * | 7/1997 | Nakamura | G01N 21/9501 356/237.3 |
| 5,790,257 A * | 8/1998 | Kim | G03F 9/70 356/401 |
| 6,465,783 B1 | 10/2002 | Nakasuji | |
| 6,617,587 B2 | 9/2003 | Parker et al. | |
| 6,791,680 B1 * | 9/2004 | Rosengaus | G01N 21/95623 356/237.5 |
| 6,940,592 B2 * | 9/2005 | Borden | G01N 21/9501 250/559.27 |
| 6,950,188 B2 * | 9/2005 | Wu | G03F 9/7011 356/401 |
| 7,072,034 B2 * | 7/2006 | Rosengaus | G01N 21/9501 356/237.5 |
| 7,244,932 B2 | 7/2007 | Nakasuji et al. | |
| 7,724,375 B1 * | 5/2010 | Novikov | G01B 9/02027 356/498 |
| 7,751,046 B2 * | 7/2010 | Levy | G01N 21/27 356/636 |
| 8,196,067 B2 | 6/2012 | Yamada et al. | |
| 8,368,015 B2 | 2/2013 | Platzgummer et al. | |
| 8,670,031 B2 * | 3/2014 | Case | G01N 21/8806 382/150 |
| 8,681,211 B2 * | 3/2014 | Haugan | G01N 21/8806 382/150 |
| 8,836,943 B2 * | 9/2014 | Ahn | G03F 9/7088 356/400 |
| 8,872,912 B2 * | 10/2014 | Case | G06V 10/145 348/92 |
| 9,535,014 B1 * | 1/2017 | Feldman | G02B 26/124 |
| 9,589,764 B2 | 3/2017 | Wang et al. | |
| 9,595,094 B2 * | 3/2017 | Wagenleitner | G01B 11/16 |
| 9,846,122 B2 * | 12/2017 | Buczkowski | G01J 3/2823 |
| 9,846,132 B2 | 12/2017 | Bakeman et al. | |
| 9,927,701 B2 * | 3/2018 | Kawashima | G03F 7/0002 |
| 10,026,589 B1 * | 7/2018 | Monahan | H01J 37/265 |
| 10,141,156 B2 * | 11/2018 | Neil | H01J 37/147 |
| 10,295,476 B1 * | 5/2019 | Kirshner | G01N 21/9501 |
| 10,395,958 B2 | 8/2019 | Xu | |
| 10,473,460 B2 | 11/2019 | Gutman et al. | |
| 10,769,320 B2 | 9/2020 | Kuznetsov et al. | |
| 10,775,323 B2 | 9/2020 | Gellineau et al. | |
| 10,837,919 B2 | 11/2020 | Hajaj | |
| 10,943,838 B2 | 3/2021 | Hoo et al. | |
| 11,300,524 B1 | 4/2022 | Hill et al. | |
| 11,526,086 B2 | 12/2022 | Hill et al. | |
| 11,899,375 B2 * | 2/2024 | Madsen | G03F 7/70633 |
| 2002/0015143 A1 | 2/2002 | Yin et al. | |
| 2003/0066963 A1 | 4/2003 | Parker et al. | |
| 2004/0075879 A1 | 4/2004 | Karin | |
| 2006/0033035 A1 | 2/2006 | Itzkovitch et al. | |
| 2009/0213364 A1 | 8/2009 | Matsui | |
| 2012/0225152 A1 * | 9/2012 | Wuister | G03F 9/7088 425/150 |
| 2012/0262709 A1 | 10/2012 | Uto et al. | |
| 2013/0235374 A1 | 9/2013 | Biellak et al. | |
| 2018/0122668 A1 | 5/2018 | He et al. | |
| 2019/0003988 A1 | 1/2019 | Solarz et al. | |
| 2019/0252270 A1 | 8/2019 | Hoo et al. | |
| 2020/0124408 A1 | 4/2020 | Hill et al. | |
| 2021/0240089 A1 | 8/2021 | Golotsvan et al. | |

FOREIGN PATENT DOCUMENTS

| | | | |
|---|---|---|---|
| JP | H10501333 A | 2/1998 | |
| JP | 2014206547 A * | 10/2014 | ......... G01N 21/8851 |
| KR | 20180098340 A | 9/2018 | |
| WO | 9533189 A1 | 12/1995 | |
| WO | 2004031754 A1 | 4/2004 | |
| WO | 2016032549 A1 | 3/2016 | |
| WO | 2018048938 A1 | 3/2018 | |
| WO | 2018144959 A1 | 8/2018 | |
| WO | 2020064290 A1 | 4/2020 | |
| WO | 2020097137 A1 | 5/2020 | |

OTHER PUBLICATIONS

PCT International Search Report and Written Opinion for International Application No. PCT/US2021/056943 dated Feb. 16, 2022, 12 pages.
Taiwan Patent Office, Office Action received in TW Application No. 110136645, Feb. 15, 2024, 23 pages (including translation).
European Patent Office, Extended European Search Report received in EP Application No. 21895325.5, Oct. 9, 2024, 9 pages.
Korean Intellectual Property Office, Office Action received in KR Application No. 10-2023-7019862, May 3, 2025, 22 pages (including translation).
Taiwan Patent Office, Office Action received in TW Application No. 113147654, Apr. 28, 2025, 13 pages (including translation).

\* cited by examiner

MASSIVE OVERLAY METROLOGY SAMPLING WITH MULTIPLE MEASUREMENT COLUMNS

CROSS-REFERENCE TO RELATED APPLICATION

The present application is a continuation of and claims the benefit of U.S. patent application Ser. No. 17/210,793 filed on Mar. 24, 2021 and entitled MASSIVE OVERLAY METROLOGY SAMPLING WITH MULTIPLE MEASUREMENT COLUMNS, which claims the benefit under 35 U.S.C. § 119(e) of U.S. Provisional Application Ser. No. 63/116,163, filed Nov. 20, 2020, entitled MASSIVE OVERLAY METROLOGY SAMPLING FOR SEMICONDUCTORS WAFER LITHOGRAPHY AND PATTERNING PROCESS CONTROL BY MULTI OPTICAL COLUMNS AND SIGNAL MULTIPLEXING, both of which are incorporated herein by reference in the entirety.

TECHNICAL FIELD

The present disclosure relates generally to optical metrology and, more particularly, to optical metrology with multiple measurement columns for high-throughput sampling.

BACKGROUND

Demands to decrease feature size and increase feature density are resulting in correspondingly increased demand for accurate and efficient metrology.

One approach to increasing the efficiency and throughput of a metrology system is to utilize an optical metrology tool and dedicated metrology targets suitable for measurement with the optical metrology tool. For example, optical metrology may generally provide relatively higher throughput measurements than particle-based metrology systems such as, but not limited to, electron-beam (e-beam) metrology systems, but the accuracy may be limited by the wavelength of light in the system. Nonetheless, the use of dedicated overlay targets as well as sampling of larger numbers of samples distributed across a sample may provide sufficient accuracy using optical techniques with a total throughput that surpasses a particle-based system.

Next-generation semiconductor devices may require sub-nanometer overlay accuracy requirements associated with the relative registration of successive layers in a semiconductor fabrication process. As overlay tolerances become tighter, the number of overlay targets required to provide the requisite level of control continues to increase. Therefore, it is desirable to provide systems and methods for providing accurate and efficient metrology.

SUMMARY

A multi-column metrology tool is disclosed in accordance with one or more illustrative embodiments of the present disclosure. In one illustrative embodiment, the tool includes two or more measurement columns distributed along a column direction, where the two or more measurement columns simultaneously probe two or more measurement regions on a sample including a plurality of metrology targets. In another illustrative embodiment, a particular measurement column of the two or more measurement columns includes an illumination sub-system to direct illumination from at least one of one or more illumination sources to the sample, a collection sub-system including a collection lens to collect measurement signals from the sample and direct the measurement signals to one or more detectors, and a column-positioning sub-system to adjust a position of the collection lens within a lateral plane parallel to a sample plane for a measurement. In another illustrative embodiment, a measurement region of the particular measurement column is defined by a field of view of the collection lens and a range of the positioning system in the lateral plane. In another illustrative embodiment, the tool includes a sample-positioning sub-system to scan the sample along a scan path different than the column direction, where the scan path positions metrology targets of the plurality of metrology targets within the measurement regions of the two or more measurement columns for measurements. In another illustrative embodiment, the column-positioning sub-systems of the two or more measurement columns position the collection lenses of the two or more measurement columns to align the metrology targets in the measurement regions along the scan path to the fields of view of the collection lenses for the measurements.

A multi-column metrology tool is disclosed in accordance with one or more illustrative embodiments of the present disclosure. In one illustrative embodiment, the tool includes two or more measurement columns distributed in a two-dimensional pattern, where the two or more measurement columns simultaneously probe two or more measurement regions on a sample including a plurality of metrology targets, and where measurement regions of the two or more measurement columns are distributed to cover one or more selected areas of the sample including at least some of the plurality of metrology targets. A particular measurement column of the two or more measurement columns may include an illumination sub-system to direct illumination from at least one of one or more illumination sources to the sample, a collection sub-system including a collection lens to collect measurement signals from the sample and direct the measurement signals to one or more detectors, and a column-positioning sub-system to adjust a position of the collection lens within a lateral plane parallel to a sample plane for a measurement, where a measurement region of the particular measurement column is defined by a field of view of the collection lens and a range of the positioning system in the lateral plane. In another illustrative embodiment, the column-positioning sub-systems of the two or more measurement columns adjust the positions of the respective collection lenses to align with metrology targets of the plurality of metrology targets in the respective measurement regions.

A multi-column metrology method is disclosed in accordance with one or more illustrative embodiments of the present disclosure. In one illustrative embodiment, the method includes providing illumination to two or more measurement columns, where the two or more measurement columns simultaneously probe two or more measurement regions on a sample including a plurality of metrology targets. In another illustrative embodiment, a particular measurement column of the two or more measurement columns includes an illumination sub-system to direct illumination from at least one of one or more illumination sources to the sample, a collection sub-system including a collection lens to collect measurement signals from the sample and direct the measurement signals to one or more detectors, and a column-positioning sub-system to adjust a position of the collection lens within a lateral plane parallel to a sample plane for a measurement, where a measurement region of the particular measurement column is defined by a field of view of the collection lens and a range of the positioning system in the lateral plane. In another illustrative embodiment, the method includes directing the illumination light to metrology targets within measurement fields of view of the two or more measurement columns. In another illustrative embodiment, the method includes collecting multiplexed measurement signals by the two or more measurement columns. In another illustrative embodiment, the method includes detecting the multiplexed measurement signals on one or more detectors. In another illustrative embodiment, the method includes generating metrology data for the metrology targets based on the detected measurement signals.

A multi-column metrology method is disclosed in accordance with one or more illustrative embodiments of the present disclosure. In one illustrative embodiment, the method includes generating a first set of calibration measurements of one or more calibration targets on a sample using one or more calibration measurement columns of a multi-column metrology tool. In another illustrative embodiment, the method includes generating a second set of calibration measurements of the one or more calibration targets using one or more test measurement columns of the multi-column metrology tool, where the one more test measurement columns provide different measurement accuracies than the one or more calibration columns. In another illustrative embodiment, a particular calibration measurement column or a particular test measurement column includes an illumination sub-system to direct illumination from at least one of one or more illumination sources to the sample, a collection sub-system including a collection lens to collect measurement signals from the sample and direct the measurement signals to one or more detectors, and a column-positioning sub-system to adjust a position of the collection lens within a lateral plane parallel to a sample plane for a measurement, where a measurement region of the particular measurement column is defined by a field of view of the collection lens and a range of the positioning system in the lateral plane. In another illustrative embodiment, the method includes calibrating the one or more test measurement columns based on first and second sets of calibration measurements. In another illustrative embodiment, the method includes generating one or more calibrated measurements of one or more test targets different than the one or more calibration targets using the one or more test measurement columns.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
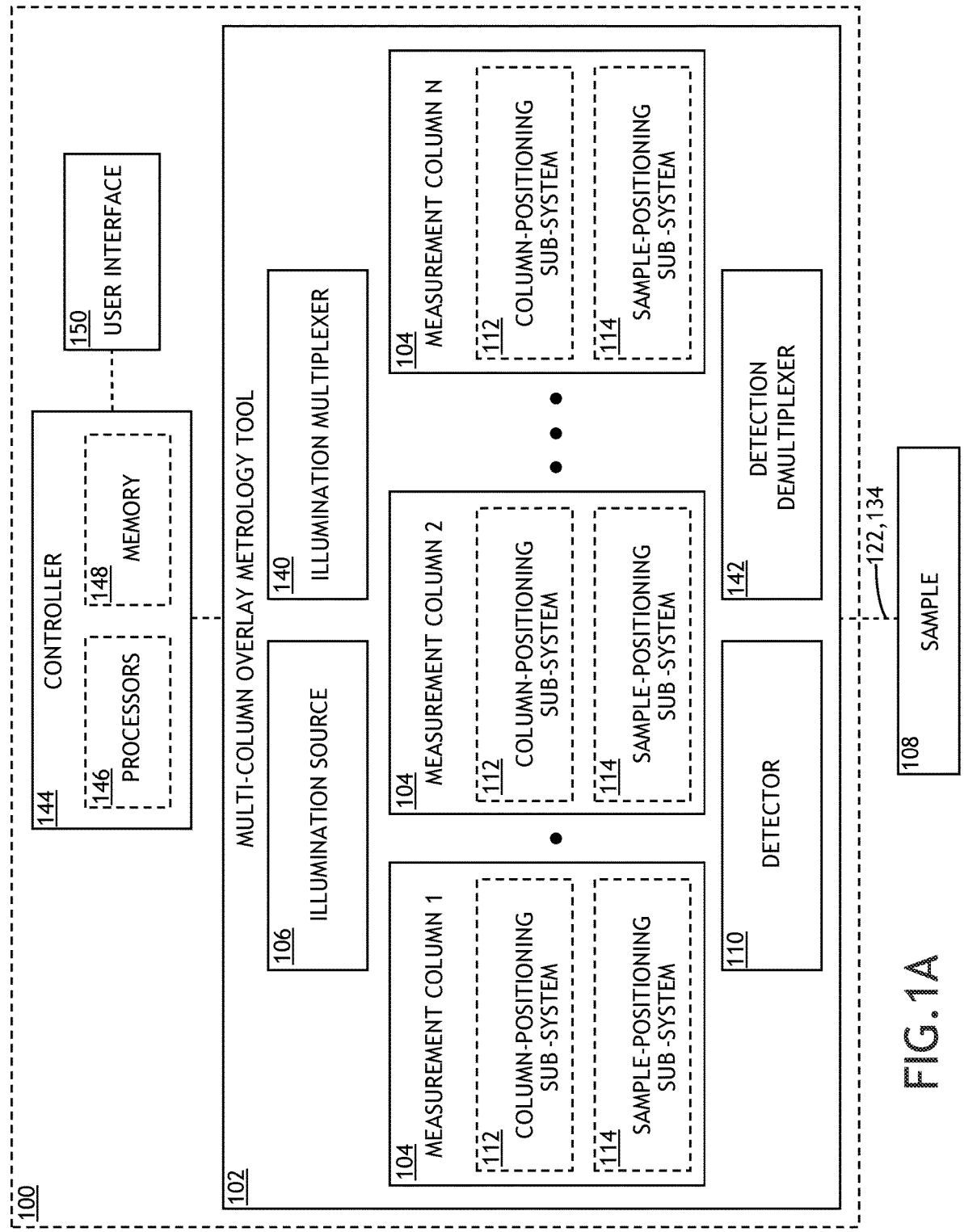
FIG. 1A is a conceptual view of an optical metrology system with an overlay metrology tool having multiple measurement columns in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to multi-column overlay metrology to provide high-throughput sampling of overlay targets distributed across a sample. In some embodiments, an overlay metrology tool includes multiple measurement columns, where each measurement column includes an illumination sub-system to direct illumination from an illumination source to a sample, a collection sub-system to collect light from the sample as measurement signals and direct the measurement signals to a detector. Additionally, at least some of the measurement columns may include a dedicated column-positioning sub-system (e.g., with one or more translation stages) to provide independent positioning of the measurement column in any direction. As a result, each measurement column may have a measurement region based on both a measurement field of view of the collection sub-system (e.g., associated with a spatial extent of the sample from which the collection sub-system may collect measurement signals) as well as range of motion of the column-positioning sub-system. It is contemplated herein that multiple measurement columns combined with independent positioning of at least some of the measurement columns may provide a flexible platform for parallel measurements of metrology targets across the sample with a high total measurement throughput.

It is contemplated herein that a measurement column may generally include any type of illumination source known in the art suitable for providing overlay measurements. For example, a measurement column may include an optical measurement column for illuminating the sample with light with a selected spectrum and capturing reflected, diffracted, and/or scattered light from the sample for a measurement. An optical measurement column may utilize any selected wavelength or wavelengths of illumination including, but not limited to, extreme ultraviolet (EUV), deep ultraviolet (DUV), vacuum ultraviolet (VUV), ultraviolet (UV), visible, or infrared (IR) wavelengths. By way of another example, a measurement column may include an x-ray measurement column for illuminating the sample with x-ray illumination and collected x-ray measurement signals from the sample for a measurement. By way of another example, a measurement column may include a particle-beam measurement column for illuminating the sample with particle beams such as, but not limited to, electron beams, ion beams, or neutral particle beams. A particle-beam measurement column may then collect various measurement signals such as, but not limited to, backscattered electrons, secondary electrons, or luminescence from the sample for a measurement. Further, a multi-column overlay tool may include any combination of measurement columns with any selected illumination sources.

For the purposes of the present disclosure, the term overlay metrology broadly refers to measurements of misalignment of features formed through two or more exposures on a common portion of the sample. In this regard, overlay metrology may provide measurements of the alignment of features formed on two or more layers on a sample as well as measurements of the alignment of features formed through successive exposures on a common sample layer (e.g., double patterning, triple patterning, or the like). Further, overlay measurements may be performed at any suitable location on the sample. For example, overlay measurements may be performed on one or more overlay targets designed to provide overlay measurements representative of device features of interest. Such overlay targets may be located with dies on a sample, in scribe lines, or any other suitable location. By way of another example, overlay measurements may be performed directly on device features. Further, overlay measurements may be performed on features associated with any step in a fabrication process. In this regard, the systems and methods disclosed herein are generally applicable to, but are not limited to, after development inspection (ADI), after etch inspection (AEI), or after clean inspection (ACI). For the purposes of the present disclosure, the term overlay target is used to broadly describe any suitable portion of a sample to be characterized by a measurement column of an overlay metrology tool including, but not limited to, dedicated overlay targets or device features suitable for direct overlay measurements.

The speed at which a translation stage in a measurement column may adjust a position of a measurement column may be based at least in part on the mass of the measurement column. The greater the mass, the slower the positioning speed. Accordingly, it may be desirable to limit the number and/or mass of components that are positioned in a measurement column. In some embodiments, at least one of the measurement columns receives illumination from an illumination source external to the measurement column. In this way, the measurement column need not include the mass associated with an illumination source. Similarly, in some embodiments, at least one of the measurement columns directs measurement signals to a detector external to the measurement column. However, it is to be understood that the present disclosure extends to metrology systems having any combination of illumination sources or detectors on the measurement columns. Further, a measurement column may be coupled with external components (e.g., an illumination source, a detector, or the like) using any technique known in the art including, but not limited to, optical fibers or free-space optics.

Additional embodiments of the present disclosure are directed to multiplexing and/or de-multiplexing of illumination from illumination sources or measurement signals directed to detectors. In this way, measurement columns may share an illumination source and/or a detector.

In some embodiments, illumination from an illumination source is split along multiple paths and directed to multiple measurement columns (e.g., some or all of the measurement columns). For example, the illumination directed to the sample through the various measurement columns may generally have common properties (e.g., polarization, wavelength, temporal properties, particle energy, or the like) to provide common illumination conditions through the various measurement columns. By way of another example, the illumination directed to the sample through the various measurement columns may have different properties. In this configuration, the illumination may be multiplexed based on one or more properties of the illumination.

In some embodiments, measurement signals from multiple measurement columns are directed to a common detector. In this configuration, the measurement signals directed to the common detector from the various measurement columns may have different properties (e.g., polarization, wavelength, temporal properties, or the like). Further, the measurement signals from the various measurement columns may be multiplexed based on one or more properties of the measurement signals. The detector may then receive the measurement signals and generate separate detector signals associated with each measurement column. In another embodiment, the metrology system further includes a detection demultiplexer to receive the multiplexed light from the various measurement columns and arrange them along a common path prior to being directed to one or more detectors.

Additional embodiments of the present disclosure are directed to various configurations of independently-positionable measurement columns to facilitate massive sampling of many metrology targets distributed across a sample. In some embodiments, multiple measurement columns are distributed along a line along a column direction.

For example, a metrology system may include measurement columns along a spatial extent at least as long as a dimension of the sample. In this way, the sample may be scanned along a scan direction that may be, but is not required to be, orthogonal to the column direction. In this configuration metrology targets may be distributed along linear paths along the scan direction such that scanning the sample along the scan direction may bring the metrology targets within measurement regions of the various measurement columns. Further, the column-positioning sub-systems may adjust the positions of the measurement columns as necessary to probe the metrology targets.

By way of another example, a metrology system may include measurement columns distributed in a two-dimensional pattern across a sample. In this regard, the measurement regions of the various measurement columns may be distributed in two dimensions across the sample and the column-positioning sub-systems may position each of the measurement columns to probe the metrology targets within its associated measurement region.

It is further contemplated herein that a metrology system including independently-positionable measurement columns may probe metrology targets in either a scanning mode in which the sample is in motion during a measurement or a static mode (e.g., a move-and-measure or MAM mode) in which the sample is static during a measurement. Further, the metrology system may switch between scanning and static modes as necessary.

Additional embodiments of the present disclosure are directed to self-calibration of a multi-column overlay tool having measurement columns with different illumination sources. Overlay metrology tools having different illumination sources may have different tradeoffs between measurement accuracy and measurement throughput. For example, a particle-beam metrology system (e.g., an e-beam metrology system) may provide relatively high accuracy but relatively low throughput, whereas an optical metrology system may provide relatively higher throughput but a relatively lower accuracy. However, it is contemplated herein that metrology data from one measurement column of a multi-column overlay tool may be used to calibrate metrology data from another measurement column to provide the advantages of both types of measurement columns. Training one metrology tool with data from a second metrology tool is generally described in U.S. Patent Publication No. 2019/0003988 published on Jan. 3, 2019, which is incorporated herein by reference in its entirety. Embodiments of the present disclosure are directed to using a single overlay tool with different types of measurement columns to provide self-calibrated measurement data. Such a tool may benefit from rapid self-calibration, decreased complexity, and decreased cost relative to multi-tool systems.

In some embodiments, a multi-column overlay metrology tool includes one or more measurement columns of a first type and one or more measurement columns of a second type, where the measurement columns of the first and second types may have different throughput and/or measurement accuracy. For example, a measurement column of a first type may have a relatively higher accuracy and a relatively lower throughput than a measurement column of the second type. As a non-limiting illustration, measurement columns of the first type may include, but are not limited to, particle-beam metrology columns or x-ray metrology columns, whereas the measurement columns of the second type may include, but are not limited to, optical metrology columns. The multi-column metrology tool may then generate overlay measurements of one or more overlay targets using measurement columns of both the first and second types and then calibrate the metrology data from the measurement columns of the second type with metrology data from the measurement columns of the second type. In this way, the calibrated measurement columns of the second type may provide increased accuracy (e.g., compared to a non-calibrated configuration) while maintaining the relatively high throughput. As a result, the multi-column metrology tool may provide measurements of future overlay targets using only the calibrated measurement columns of the second type to generate accurate overlay data at a high throughput.

Referring now to FIGS. 1A-7, systems and methods for metrology using multiple measurement columns is described in greater detail in accordance with one or more embodiments of the present disclosure.

FIG. 1A is a conceptual view of an overlay metrology system 100 with a multi-column overlay metrology tool 102 having multiple measurement columns 104 in accordance with one or more embodiments of the present disclosure. For example, FIG. 1A illustrates a multi-column overlay metrology tool 102 having N measurement columns 104. In a general sense, the overlay metrology system 100 may include any number of measurement columns 104.

In one embodiment, the multi-column overlay metrology tool 102 includes at least one illumination source 106 to generate illumination 134 to be directed to a sample 108 through one or more measurement columns 104 and at least one detector 110 to capture a measurement signal from the sample 108 (e.g., light and/or particles from the sample 108) by one or more measurement columns 104. Further, any particular measurement column 104 may be configured in a reflection configuration (e.g., in which the measurement signal includes reflected, diffracted, or scattered light on the same side of the sample 108 as the incident illumination 134) or in a transmission configuration (e.g., in which the measurement signal includes transmitted, diffracted, or scattered light on an opposite side of the sample 108 as the incident illumination 134).

An illumination source 106 (e.g., one of one or more illumination sources 106 in the overlay metrology system 100) may include any type of source suitable for generating illumination suitable for overlay measurements. For example, the illumination source 106 may include an electromagnetic source to generate electromagnetic illumination 134 having wavelengths in any region of the electromagnetic spectrum including, but not limited to x-rays, EUV, DUV, VUV, UV, visible, or IR spectral ranges. By way of another example, the illumination source 106 may include a particle beam source to generate particle-based illumination 134 such as, but not limited to, electron beams (e-beams), ion beams, or neutral particle-beams.

In one embodiment, the illumination source 106 is a laser source. For example, the illumination source 106 may include, but is not limited to, one or more narrowband laser sources, a broadband laser source, a supercontinuum laser source, a white light laser source, or the like. In this regard, the illumination source 106 may provide illumination having high coherence (e.g., high spatial coherence and/or temporal coherence).

In another embodiment, the illumination source 106 includes a plasma source such as, but not limited to, a laser-sustained plasma (LSP) source. For example, the illumination source 106 may include, but is not limited to, a LSP lamp, a LSP bulb, or a LSP chamber suitable for containing one or more elements that, when excited by a laser source into a plasma state, may emit broadband illumination. In another embodiment, the illumination source 106 includes a lamp source. For example, the illumination source 106 may include, but is not limited to, an arc lamp, a discharge lamp, an electrode-less lamp, or the like. In this regard, the illumination source 106 may provide illumination having low coherence (e.g., low spatial coherence and/or temporal coherence).

In another embodiment, the illumination source 106 includes an x-ray source for generating any wavelength of x-ray illumination 134 including, but not limited to, hard or soft x-rays. For example, the illumination source 106 may include a hard x-ray source for forming a spatially coherent hard x-ray beam having energies between approximately 3 to 20 keV. For instance, the illumination 134 may include x-rays having energies between approximately 5 and 6 keV. By way of another example, the illumination source 106 may include a laser produced plasma (LPP) x-ray source. For example, the illumination source 106 may include a laser source configured to generate a laser beam for pumping a plasma. Responsive to the laser radiation, the plasma may produce a spatially coherent x-ray beam. By way of another example, the illumination source 106 may include, but is not limited to, a Compton x-ray source.

In some embodiments, the illumination source 106 or the multi-column overlay metrology tool 102 more generally may include any number of conditioning elements configured to improve the coherence of x-ray illumination 134. For example, a measurement column 104 may include, but is not limited to, one or more x-ray optics for capturing, refocusing, spatial filtering and/or conditioning the x-ray output from the plasma to achieve a desired level of spatial coherence.

In another embodiment, the illumination source 106 includes a particle source. For example, the illumination source 106 may include, but is not limited to, an electron gun or an ion gun. In another embodiment, the illumination source 106 is configured to provide a particle beam with a tunable energy. For example, an illumination source 106 including an electron source may, but is not limited to, provide an accelerating voltage in the range of 0.1 kV to 30 kV. As another example, an illumination source 106 including an ion source may, but is not required to, provide an ion beam with an energy in the range of 1 to 50 keV.

The illumination source 106 may further provide, but is not required to provide, illumination in the form of one or more illumination beams or illumination lobes. In this regard, the multi-column overlay metrology tool 102 may provide dipole illumination, quadrature illumination, or the like. Multiple illumination beams may be generated in a variety of ways. In one embodiment, the multi-column overlay metrology tool 102 includes one or more apertures at an illumination pupil plane to divide illumination from the illumination source 106 into one or more illumination beams. In another embodiment, the overlay metrology system 100 directly generates illumination in one or more illumination beams. For example, one or more illumination sources 106 may directly generate illumination in one or more illumination beams. For instance, one or more illumination sources 106 may provide light in two or more optical fibers, where light output from each optical fiber provides an illumination beam. These optical fibers may be arranged in an illumination pupil or may be paired with separate illumination optics to directly illuminate the sample 108. In another instance, the illumination source 106 generates a multi-lobe illumination by diffracting a light source into two or more diffraction orders, where the illumination lobes of the illumination are formed from at least some of the diffraction orders of the light source. Efficient generation of multiple illumination lobes through controlled diffraction is generally described in U.S. Patent Publication No. US2020/0124408 published on Apr. 23, 2020, which is incorporated herein by reference in its entirety. By way of another example, the overlay metrology system 100 may include one or more beam-steering or diffractive optics to selectively adjust a position of at least one illumination beam in an illumination pupil plane to provide selective control over the illumination incidence angles.

Additionally, the spatial profile of the illumination including one or more illumination beams on the sample 108 may be controlled by an illumination field stop to have any selected spatial profile.

The multi-column overlay metrology tool 102 may include any number or type of detectors 110 suitable for capturing measurement signals 122 from the sample 108 indicative of overlay. For example, a detector 110 may include one or more sensors suitable for capturing light of any wavelength in the electromagnetic spectrum (e.g., a photodetector, a photomultiplier tube (PMT), an x-ray detector, or the like). By way of another example, a detector 110 may include one or more particle detectors suitable for capturing particles (e.g., electrons, ions, neutral particles) from the sample 108. By way of another example, a detector 110 may include a scintillating element coupled to an optical detector for detecting particles and/or photons from the sample surface.

In one embodiment, the detector 110 is suitable for characterizing a static sample 108. In this regard, the multi-column overlay metrology tool 102 may operate in a static mode in which the sample 108 is static during a measurement. For example, a detector 110 may include an imaging detector with a 2D pixel array suitable for generating a 2D image (e.g., a field-plane image, a pupil-plane image, or the like) such as, but not limited to, a charge-coupled device (CCD) or a complementary metal-oxide semiconductor (CMOS) device.

In another embodiment, a detector 110 includes one or more detectors 110 suitable for characterizing a moving sample 108 (e.g., a scanned sample 108). In this regard, the multi-column overlay metrology tool 102, or any measurement column 104 therein, may operate in a scanning mode in which the sample 108 is scanned with respect to a measurement field during a measurement. For example, the detector 110 may include a 2D pixel array with a capture time and/or a refresh rate sufficient to capture one or more images during a scan within selected image tolerances (e.g., image blur, contrast, sharpness, or the like). By way of another example, the detector 110 may include a line-scan detector to continuously generate an image one line of pixels at a time. By way of another example, the detector 110 may include a time delay and integration (TDI) detector to generate a continuous image of the sample 108 when the motion of the sample 108 is synchronized to charge-transfer clock signals in the TDI detector.

In another embodiment, a measurement column 104 (e.g., one or more of the N measurement columns 104) includes a column-positioning sub-system 112 to provide independent positioning of the measurement column 104. The column-positioning sub-system 112 may include one or more actuators configured to independently position the measurement column 104 along one or more directions. For example, the column-positioning sub-system 112 may include, but is not limited to, one or more linear translation stages, one or more rotational translation stages, or one or more tip/tilt actuators. In this way, the column-positioning sub-system 112 of a measurement column 104 may position the components of the measurement column 104 with respect to the sample 108 along any desired dimension. For example, the column-positioning sub-system 112 may facilitate alignment of the measurement column 104 with metrology targets on the sample 108.

In another embodiment, the overlay metrology system 100 includes a sample-positioning sub-system 114 to secure and/or position the sample 108 with respect to any of the measurement columns 104. The sample-positioning sub-system 114 may include one or more actuators configured to independently position the sample 108 along one or more directions. For example, the sample-positioning sub-system 114 may include, but is not limited to, one or more linear translation stages, one or more rotational translation stages, or one or more tip/tilt actuators. In this way, the sample-positioning sub-system 114 may position the sample 108 at any selected orientation with respect to the measurement columns 104.

Figure 1B:
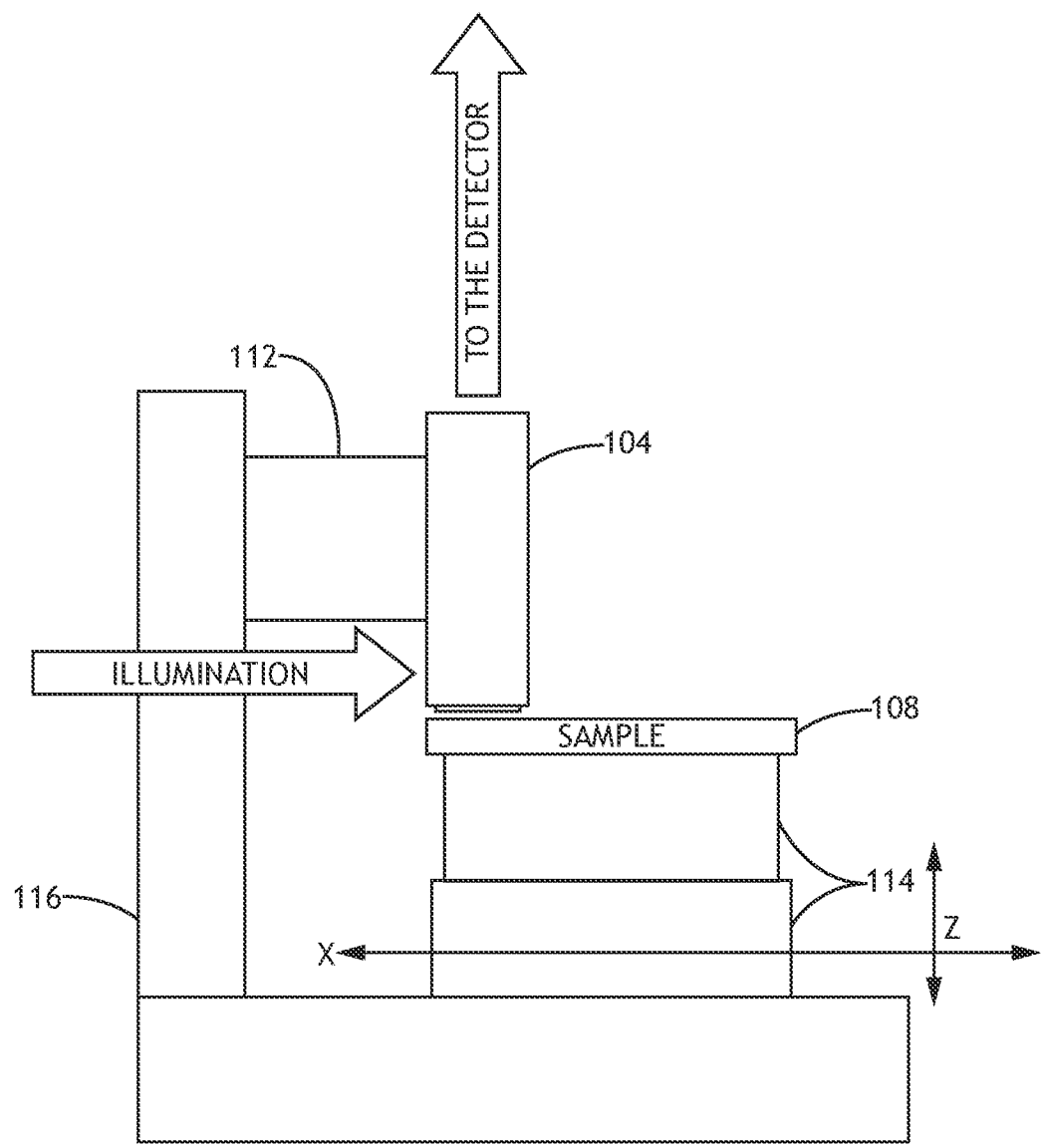
FIG. 1B is a conceptual view of an optical metrology system illustrating the relative positioning of a measurement column and a sample in accordance with one or more embodiments of the present disclosure.

FIG. 1B is a conceptual view of an overlay metrology system 100 illustrating the relative positioning of a measurement column 104 and a sample 108 in accordance with one or more embodiments of the present disclosure. In FIG. 1B, only a single measurement column 104 is illustrated for clarity. The overlay metrology system 100 may be mounted on or otherwise include at least one structural support 116 (e.g., a table, a wall, a ceiling, or the like) to secure various components such as, but not limited to, the sample-positioning sub-system 114 and the column-positioning sub-system 112 for each of the measurement columns 104. In FIG. 1B, the sample-positioning sub-system 114 orients the sample 108 in a lateral plane (here the X-Y plane) and the measurement column 104 illuminates the sample 108 along an axial direction (here the Z direction). For example, a measurement column 104 may illuminate the sample 108 with normal-incidence light propagating along the Z axis or with oblique light with at least a directional component along the Z axis. In another embodiment, each measurement column 104 is mounted to a column-positioning sub-system 112, which itself is mounted to a structural support 116. In another embodiment, the sample-positioning sub-system 114 includes a 3D translation stage to provide lateral translation of the sample 108 along the lateral plane (the X-Y plane) as well as translation along the axial direction (the Z direction). In another embodiment, the sample-positioning sub-system 114 includes a rotational stage to rotate the sample 108 within the lateral plane.

It is contemplated herein that various configurations of measurement columns 104, illumination sources 106, and detectors 110 are possible within the spirit and scope of the present disclosure. For example, an illumination source 106 and/or a detector 110 may be located on an associated measurement column 104 or external to it. For instance, locating an illumination source 106 and/or a detector 110 external to an associated measurement column 104 may reduce the mass of the measurement column 104, which may reduce the load on the column-positioning sub-system 112. As a result, providing an illumination source 106 and/or a detector 110 external to an associated measurement column 104 may facilitate faster and/or more accurate positioning of the measurement column 104 by the column-positioning sub-system 112 than if the components were part of the measurement column 104.

Regardless of the specific positioning of an illumination source 106 and/or a detector 110 with respect to an associated measurement column 104, each measurement column 104, when coupled with an illumination source 106 and a detector 110, may be suitable for measuring overlay. In this regard, each measurement column 104 with its associated illumination source 106 and detector 110 may operate as an overlay tool and the multi-column overlay metrology tool 102 may be characterized as providing multiple overlay tools suitable for multiple parallel overlay measurements of different portions of the sample 108.

The multi-column overlay metrology tool 102, or any measurement column 104 therein, may operate as any type of overlay metrology tool known in the art. For example, the multi-column overlay metrology tool 102, or any measurement column 104 therein, may operate in an imaging mode, a non-imaging mode, or selectively switch between imaging and non-imaging modes. As an illustrative example in the case of an optical measurement column 104, a detector 110 placed at a field plane conjugate to the sample 108 may generate an image of the sample 108. This image may include a bright-field image, a dark-field image, a phase-contrast image, or the like based on the configuration of a respective illumination sub-system 118 and collection sub-system 120. By way of another example, one or more detectors 110 placed at a pupil plane may characterize the angular distribution of radiation from the sample 108 (e.g., associated with scattering and/or diffraction of radiation by the sample 108). In this way, the multi-column overlay metrology tool 102, or any measurement column 104 therein, may operate as a scatterometry (SCOL) overlay tool. Further, scatterometry overlay measurements may be performed by generating an image of the pupil plane or by capturing light at selected locations of the pupil plane with non-imaging detectors (e.g., photodiodes). For example, scatterometry overlay using non-imaging detectors in a pupil plane is described generally in U.S. Pat. No. 11,300,524 issued on Apr. 12, 2022, which is incorporated herein by reference in its entirety.

The multi-column overlay metrology tool 102, or any measurement column 104 therein, may be configurable to generate overlay signals based on any number of recipes defining measurement parameters for an overlay measurement. For example, a recipe of an optical measurement column 104 may include, but is not limited to, an illumination wavelength, a detected wavelength of light emanating from the sample, a spot size or shape of illumination on the sample, an angle of incident illumination, a polarization of incident illumination, a polarization of collected light, a position of a beam of incident illumination on an overlay target, a position of an overlay target in the focal volume of the overlay metrology tool, or the like. By way of another example, a recipe of a particle-beam measurement column 104 may include, but is not limited to, a particle beam energy or a beam scanning speed. Further, the multi-column overlay metrology tool 102, or any measurement column 104 therein, may be configured to generate an overlay measurement in a scanning mode, a static mode, or selectively switch between scanning and static modes.

Figure 1C:
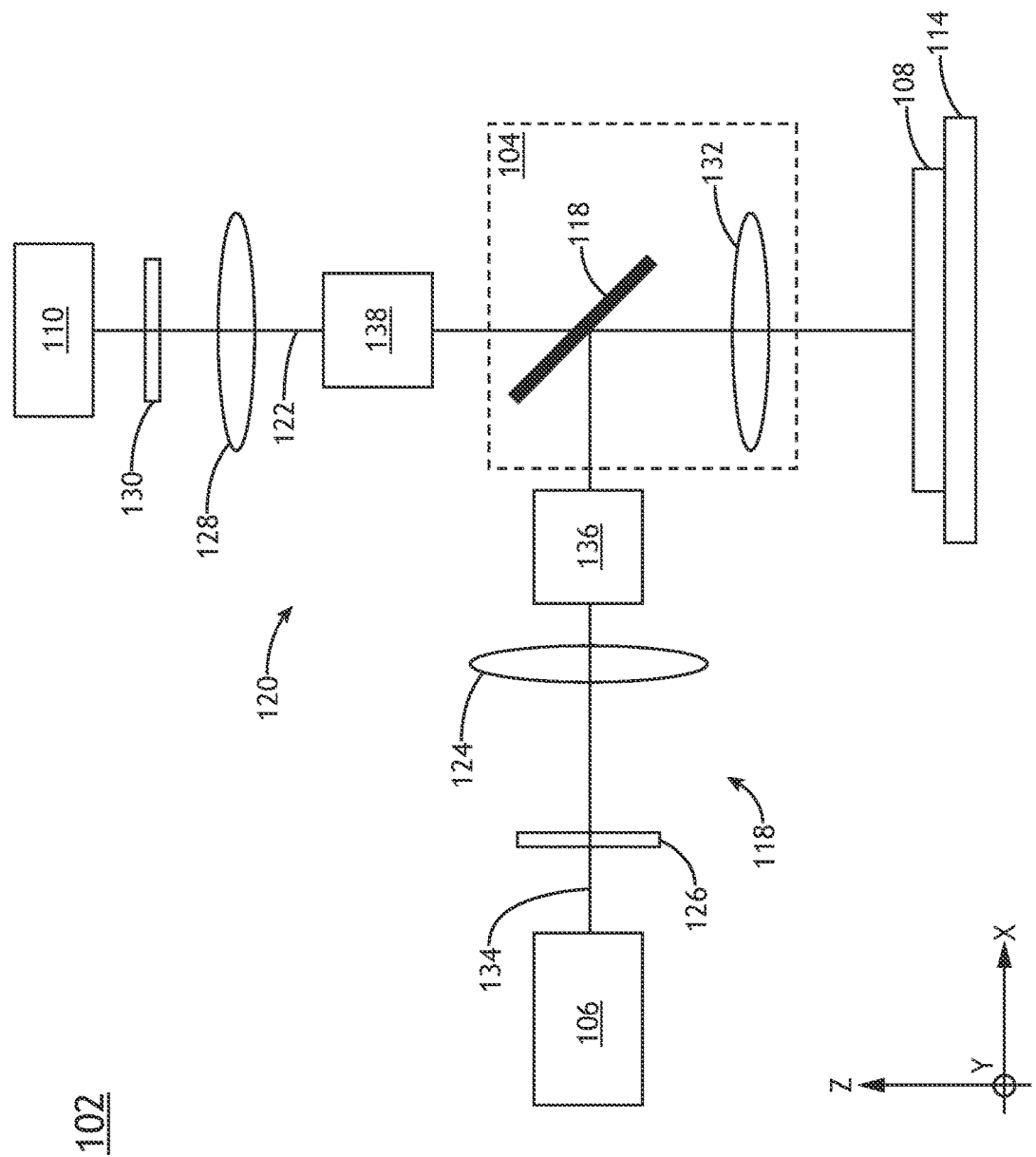
FIG. 1C is a conceptual view of a portion of a multi-column overlay metrology tool including an optical measurement column with an associated illumination source and detector providing illumination and collection through a common lens in accordance with one or more embodiments of the present disclosure.
Figure 1D:
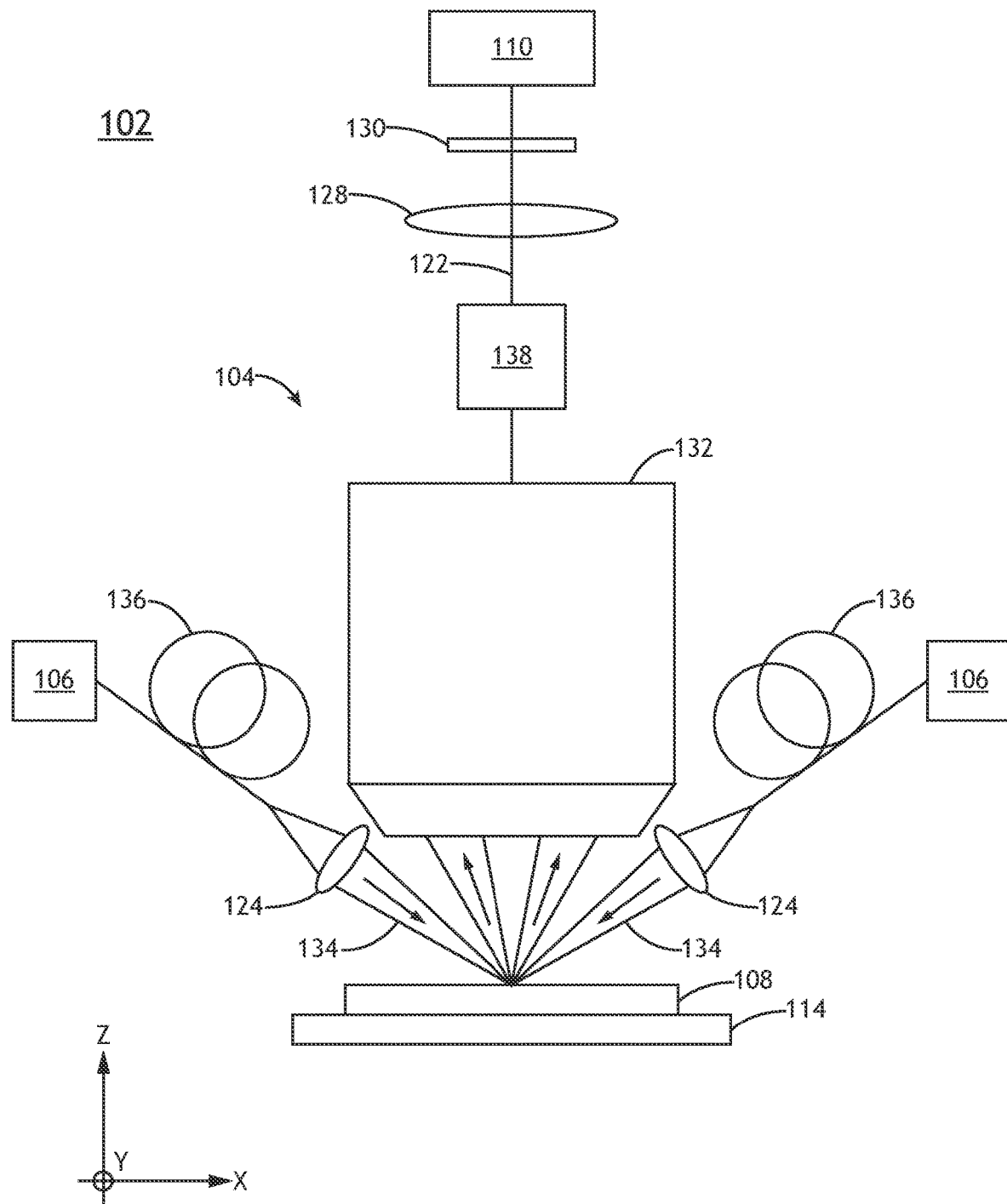
FIG. 1D is a conceptual view of a portion of a multi-column overlay metrology tool including an optical measurement column with an associated illumination source and detector providing illumination and collection through separate pathways in accordance with one or more embodiments of the present disclosure.
Figure 1E:
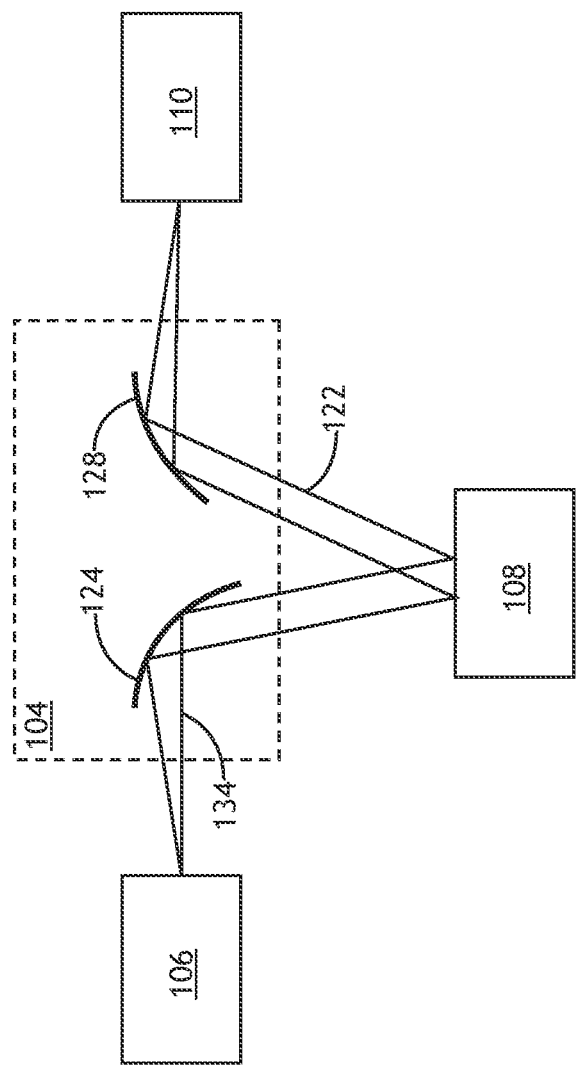
FIG. 1E is a conceptual view of a portion of a multi-column overlay metrology tool including an EUV measurement column with an associated EUV illumination source and detector in accordance with one or more embodiments of the present disclosure.
Figure 1E:
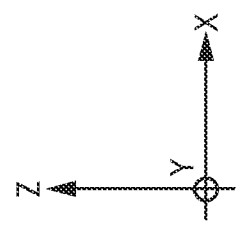
Figure 1F:
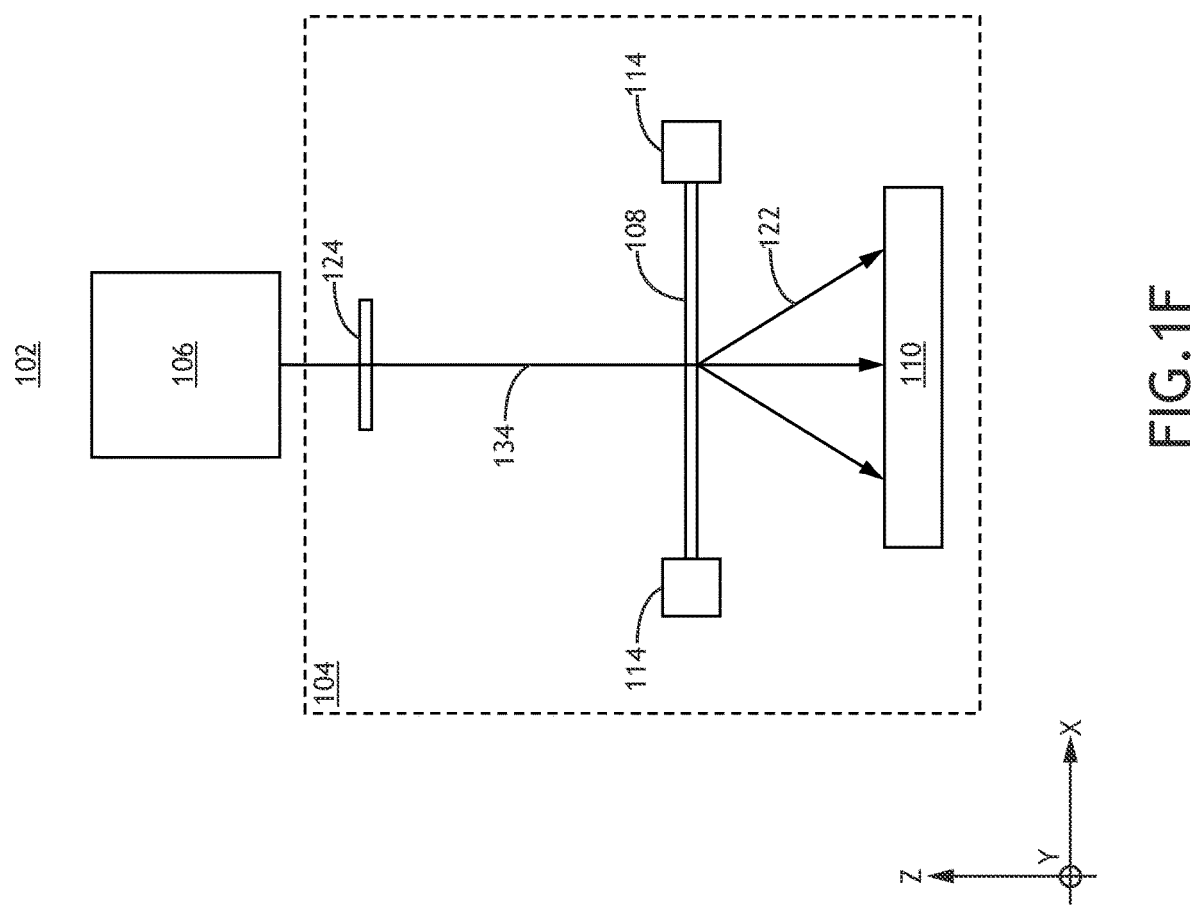
FIG. 1F is a conceptual view of a portion of a multi-column overlay metrology tool including an x-ray measurement column with an associated particle illumination source and detector in accordance with one or more embodiments of the present disclosure.
Figure 1G:
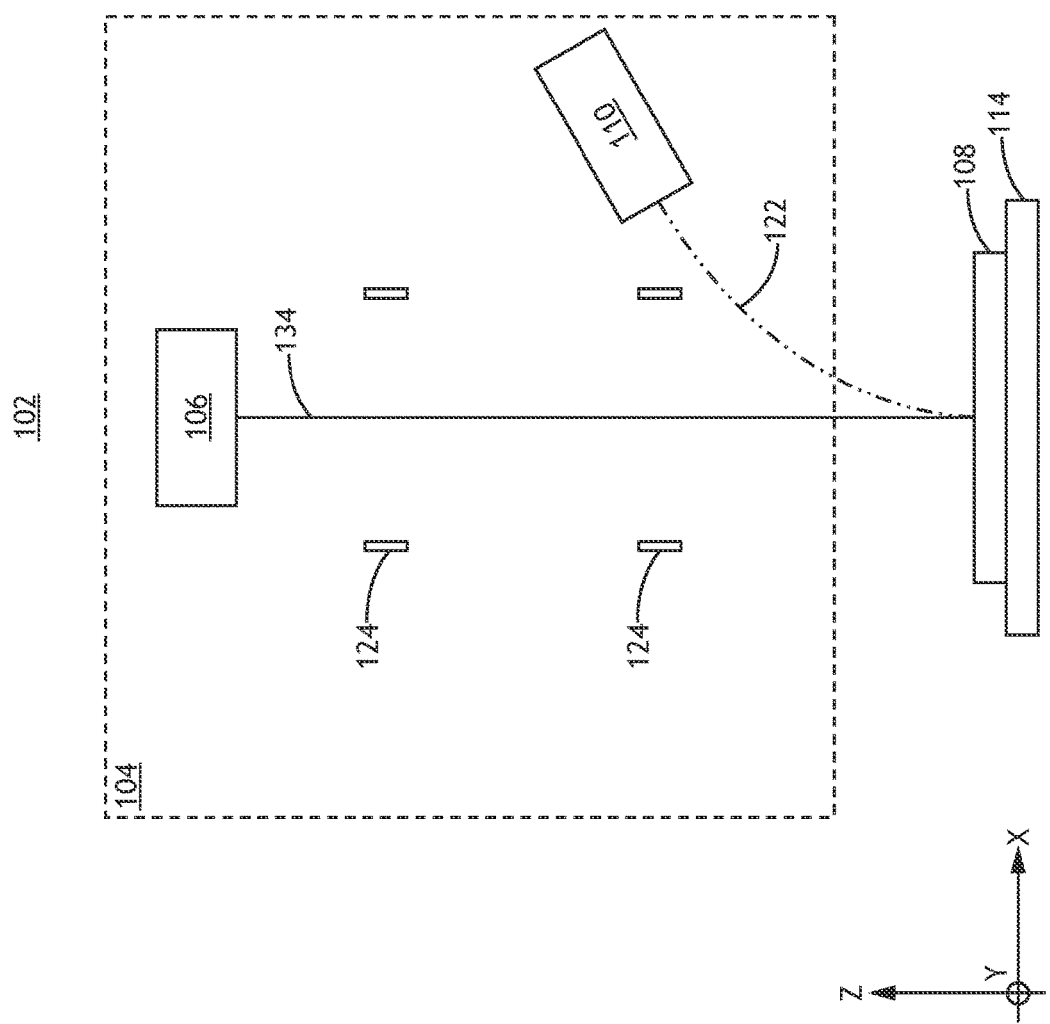
FIG. 1G is a conceptual view of a portion of a multi-column overlay metrology tool including a particle-based measurement column 10 with an associated particle illumination source and detector in accordance with one or more embodiments of the present disclosure.

Referring now to FIGS. 1C-1G, the distribution of components throughout the overlay metrology system 100 is described in greater detail in accordance with one or more embodiments of the present disclosure. In particular, FIGS. 1C and 1D illustrate aspects of an optical measurement column 104, FIG. 1E illustrates aspects of an EUV measurement column 104, FIG. 1F illustrates aspects of an x-ray measurement column 104, and FIG. 1G illustrates aspects of a particle-beam measurement column 104.

In one embodiment, a measurement column 104 (e.g., one or more of the N measurement columns 104) includes an illumination sub-system 118 configured to direct illumination from an illumination source 106 to a sample 108 (e.g., a metrology target on the sample 108) and a collection sub-system 120 to collect measurement signals 122 from the sample 108 (e.g., light, particles, or the like) and direct the measurement signals 122 to a detector 110. FIGS. 1C and 1D illustrate non-limiting examples of various configurations of the illumination sub-system 118 and the collection sub-system 120. It is contemplated herein that the various measurement columns 104 in the sample 108 may have the same or different configurations.

As illustrated in FIGS. 1C-1G, the illumination sub-system 118 may include one or more components suitable for modifying and/or conditioning the illumination 134 as well as directing the illumination 134 to the sample 108. In one embodiment, the illumination sub-system 118 includes one or more illumination-pathway focusing elements 124 (e.g., to collimate the illumination 134, to relay pupil and/or field planes, or the like). In another embodiment, the illumination sub-system 118 includes one or more illumination-pathway control elements 126 to shape or otherwise control the illumination 134. For example, the illumination-pathway control elements 126 may include, but are not limited to, one or more field stops, one or more pupil stops, one or more polarizers, one or more filters, one or more beamsplitters, one or more diffusers, one or more homogenizers, one or more apodizers, one or more beam shapers, or one or more mirrors (e.g., static mirrors, translatable mirrors, scanning mirrors, or the like).

Similarly, the collection sub-system 120 may include one or more elements suitable for modifying and/or conditioning the measurement signals 122 from the sample 108. In one embodiment, the collection sub-system 120 includes one or more collection-pathway focusing elements 128 (e.g., to collimate the measurement signals 122, to relay pupil and/or field planes, or the like). In another embodiment, the collection sub-system 120 includes one or more collection-pathway control elements 130 to shape or otherwise control the measurement signals 122. For example, the collection-pathway control elements 130 may include, but are not limited to, one or more field stops, one or more pupil stops, one or more polarizers, one or more filters, one or more beamsplitters, one or more diffusers, one or more homogenizers, one or more apodizers, one or more beam shapers, or one or more mirrors (e.g., static mirrors, translatable mirrors, scanning mirrors, or the like).

FIG. 1C is a conceptual view of a portion of a multi-column overlay metrology tool 102 including an optical measurement column 104 with an associated illumination source 106 and detector 110 providing illumination and collection through a common lens, in accordance with one or more embodiments of the present disclosure. Additional measurement columns 104 and associated illumination sources 106 and/or detectors 110 are not illustrated for clarity. In one embodiment, a measurement column 104 includes a collection lens 132 (e.g., an objective lens) to simultaneously direct illumination 134 from the illumination source 106 to the sample 108 and collect measurement signals 122 from the sample 108 for detection with the detector 110. In this regard, the measurement column 104 may provide through-the-lens (TTL) illumination of the sample 108.

FIG. 1D is a conceptual view of a portion of a multi-column overlay metrology tool 102 including an optical measurement column 104 with an associated illumination source 106 and detector 110 providing illumination and collection through separate pathways in accordance with one or more embodiments of the present disclosure. As with FIG. 1C, additional measurement columns 104 and associated illumination sources 106 and/or detectors 110 are not illustrated for clarity. In one embodiment, a measurement column 104 includes separate components and/or optical paths for the illumination sub-system 118 and the collection sub-system 120. In this regard, the measurement column 104 may provide outside-the-lens (OTL) illumination of the sample 108. For example, as illustrated in FIG. 1D, a measurement column 104 may include a collection sub-system 120 with a collection lens 132 having an optical axis oriented normal to the sample 108 (e.g., as illustrated in FIG. 1C), and an illumination sub-system 118 with two separate illumination-pathway focusing elements 124 configured to direct illumination 134 from the illumination source 106 towards the sample 108 at oblique angles outside the numerical aperture (NA) of the collection lens 132. However, although FIG. 1D illustrates oblique illumination and normal collection, it is to be understood that a measurement column 104 may provide illumination and collection at any desired angles.

FIG. 1E is a conceptual view of a portion of a multi-column overlay metrology tool 102 including an EUV measurement column 104 with an associated EUV illumination source 106 and detector 110 in accordance with one or more embodiments of the present disclosure. It is recognized herein that an EUV measurement column 104 may require different components or layouts than an optical system suitable for visible or IR wavelengths due to high absorption of EUV light in many materials.

In one embodiment, the multi-column overlay metrology tool 102 includes EUV illumination-pathway focusing elements 124 suitable for collimating or focusing EUV illumination 134 and collection-pathway focusing elements 128 (e.g., projection optics) suitable for collecting, collimating, and/or focusing EUV measurement signals 122 from the sample 108. Further, the collection-pathway focusing elements 128 may direct the EUV measurement signals 122 to one or more detectors 110. The illumination-pathway focusing elements 124 and/or the collection-pathway focusing elements 128 may include any type of focusing elements suitable for use with the wavelengths of light from the illumination source 106. For example, the illumination-pathway focusing elements 124 and/or the collection-pathway focusing elements 128 may include, but are not limited to, mirrors or other reflective surfaces (e.g., spherical mirrors, parabolic mirrors, elliptical mirrors, or the like). In this way, absorption losses may be mitigated or otherwise controlled. Further, the illumination-pathway focusing elements 124 may operate at any suitable incidence angle. For instance, glancing-angle mirrors may provide efficient reflection.

FIG. 1F is a conceptual view of a portion of a multi-column overlay metrology tool 102 including an x-ray measurement column 104 with an associated particle illumination source 106 and detector 110 in accordance with one or more embodiments of the present disclosure. Metrology using x-ray sources is generally described in U.S. Pat. No. 9,846,132 issued on Dec. 19, 2017, U.S. Pat. No. 10,775,323 issued on Sep. 15, 2020, and U.S. Patent Publication No. 2019/0003988 published on Jan. 3, 2019, all of which are incorporated herein by reference in their entirety. For example, FIG. 1F illustrates a transmissive x-ray measurement column 104.

In one embodiment, the multi-column overlay metrology tool 102 includes x-ray illumination-pathway focusing elements 124 suitable for collimating or focusing x-ray illumination 134 and collection-pathway focusing elements suitable for collecting, collimating, and/or focusing x-ray measurement signals 122 from the sample 108 such as, but not limited to, x-ray collimating mirrors. For example, the multi-column overlay metrology tool 102 may include, but is not limited to, x-ray collimating mirrors, specular x-ray optics such as grazing incidence ellipsoidal mirrors, polycapillary optics such as hollow capillary x-ray waveguides, multilayer optics, or systems, or any combination thereof. In another embodiment, the multi-column overlay metrology tool 102 includes x-ray illumination-pathway control elements such as, but not limited to, an x-ray monochromator (e.g., a crystal monochromator such as a Loxley-Tanner-Bowen monochromator, or the like) x-ray apertures, x-ray beam stops, or diffractive optics such as zone plates.

FIG. 1G is a conceptual view of a portion of a multi-column overlay metrology tool 102 including a particle-based measurement column 104 with an associated particle illumination source 106 and detector 110 in accordance with one or more embodiments of the present disclosure.

In one embodiment, the multi-column overlay metrology tool 102 includes one or more particle focusing elements. For example, FIG. 1G illustrates illumination-pathway focusing elements 124, collection-pathway focusing elements 128, or the like. For example, the one or more particle focusing elements may include, but are not limited to, a single particle focusing element or one or more particle focusing elements forming a compound system. In another embodiment, the one or more particle focusing elements include collection lens configured to direct the particle illumination 134 to the sample 108. Further, the one or more particle focusing elements may include any type of electron lenses known in the art including, but not limited to, electrostatic, magnetic, uni-potential, or double-potential lenses. It is noted herein that the description of a voltage contrast imaging inspection system as depicted in FIG. 1C and the associated descriptions above are provided solely for illustrative purposes and should not be interpreted as limiting. For example, the multi-column overlay metrology tool 102 may include any excitation source known in the art suitable for generating inspection data on a sample 108. In another embodiment, the multi-column overlay metrology tool 102 includes two or more particle beam sources (e.g., electron beam sources or ion beam sources) for the generation of two or more particle beams. In a further embodiment, the multi-column overlay metrology tool 102 includes one or more components (e.g., one or more electrodes) configured to apply one or more voltages to one or more locations of the sample 108. In this regard, the multi-column overlay metrology tool 102 may generate voltage contrast imaging data.

In another embodiment, the multi-column overlay metrology tool 102 includes one or more particle detectors 110 to image or otherwise detect particles emanating from the sample 108. In one embodiment, a detector 110 includes an electron collector (e.g., a secondary electron collector, a backscattered electron detector, or the like). In another embodiment, a detector 110 includes a photon detector (e.g., a photodetector, an x-ray detector, a scintillating element coupled to photomultiplier tube (PMT) detector, or the like) for detecting electrons and/or photons from the sample surface.

Additionally, it is contemplated herein that components associated with illuminating the sample 108 and/or collecting measurement signals 122 from the sample may be distributed within any of the measurement columns 104, external to any of the measurement columns 104, or shared between any of the measurement columns 104. For example, FIG. 1C illustrates a configuration in which the illumination source 106 and the detector 110 are located external to the measurement column 104. In configurations in which the illumination source 106 is located external to a measurement column 104, the overlay metrology system 100 may include an illumination connection pathway 136 to provide a path between the illumination source 106 and the measurement column 104. Similarly, in configurations in which the detector 110 is located external to a measurement column 104, the overlay metrology system 100 may include a detection connection pathway 138 to provide a path between the measurement column 104 and the detector 110. The illumination connection pathway 136 and/or the detection connection pathway 138 may include any combination of suitable components for providing a path for the illumination 134 and/or the measurement signals 122. As an example, in the case of optical illumination 134, the illumination connection pathway 136 and/or the detection connection pathway 138 may include one or more optical fibers. By way of another example, the illumination connection pathway 136 and/or the detection connection pathway 138 may include one or more free-space components. For instance, the illumination connection pathway 136 and/or the detection connection pathway 138 may include one or more tiltable transmitter free-space components and one or more tiltable receiver free-space components to provide a stable path as the measurement column 104 is in motion.

Accordingly, it is to be understood that the FIGS. 1C-1G are provided solely for illustrative purposes and should not be interpreted as limiting. Rather, various components of the multi-column overlay metrology tool 102 may be distributed within one or more measurement columns 104, external to any measurement columns 104, or shared between any measurement columns 104. Further, a measurement column 104 associated with any illumination source 106 may have any suitable layout of elements. For example, a measurement column 104 associated with any illumination source 106 may be configured in a reflective or transmissive mode. By way of another example, a measurement column 104 associated with any illumination source 106 may have any combination of suitable illumination-pathway focusing elements 124, illumination-pathway control elements 126, collection-pathway focusing elements 128, or collection-pathway control elements 130 whether or not illustrated in FIGS. 1C-1G.

In another embodiment, though not illustrated in FIGS. 1C-1G, a measurement column 104, the entire multi-column overlay metrology tool 102, or any portion thereof, may be enclosed in a chamber. In this way, the atmosphere and/or pressure within the chamber may be controlled. For example, the overlay metrology system 100 may include vacuum pumps to create a vacuum of a desired strength in the chamber. By way of another example, the overlay metrology system 100 may include a gas flow system to fill the chamber with a selected gas composition at a selected pressure.

In some embodiments, a collection sub-system 120 of a measurement column 104 may be configured to generate metrology data at different depths in the sample 108. For example, in the configurations illustrated in FIGS. 1C-1G, a location of a measurement plane (e.g., an image plane) of the collection lens 132 with respect to the surface of the sample 108 may be adjusted in numerous ways. In one instance, the sample 108 may be translated along the axial direction (the Z direction) by the sample-positioning system 114. In another embodiment, the measurement column 104 may be adjusted along the axial direction (the Z direction) by the column-positioning sub-system 112. In another instance, one or more of the collection-pathway focusing elements 128 may be adjusted to modify the measurement plane.

Further, measurements at multiple measurement planes may be provided sequentially or simultaneously. For example, sequential measurements may be provided by moving the sample 108 or the measurement column 104 (or a portion thereof) sequentially to provide the sequential measurements. By way of another example, simultaneous measurements may be provided with multiple detectors 110 and associated collection-pathway focusing elements 128 configured to generate different measurement planes for each of the detectors 110.

Referring now to FIGS. 2A-3B, various implementations of illumination and collection are described in greater detail in accordance with one or more embodiments of the present disclosure.

Figure 2A:
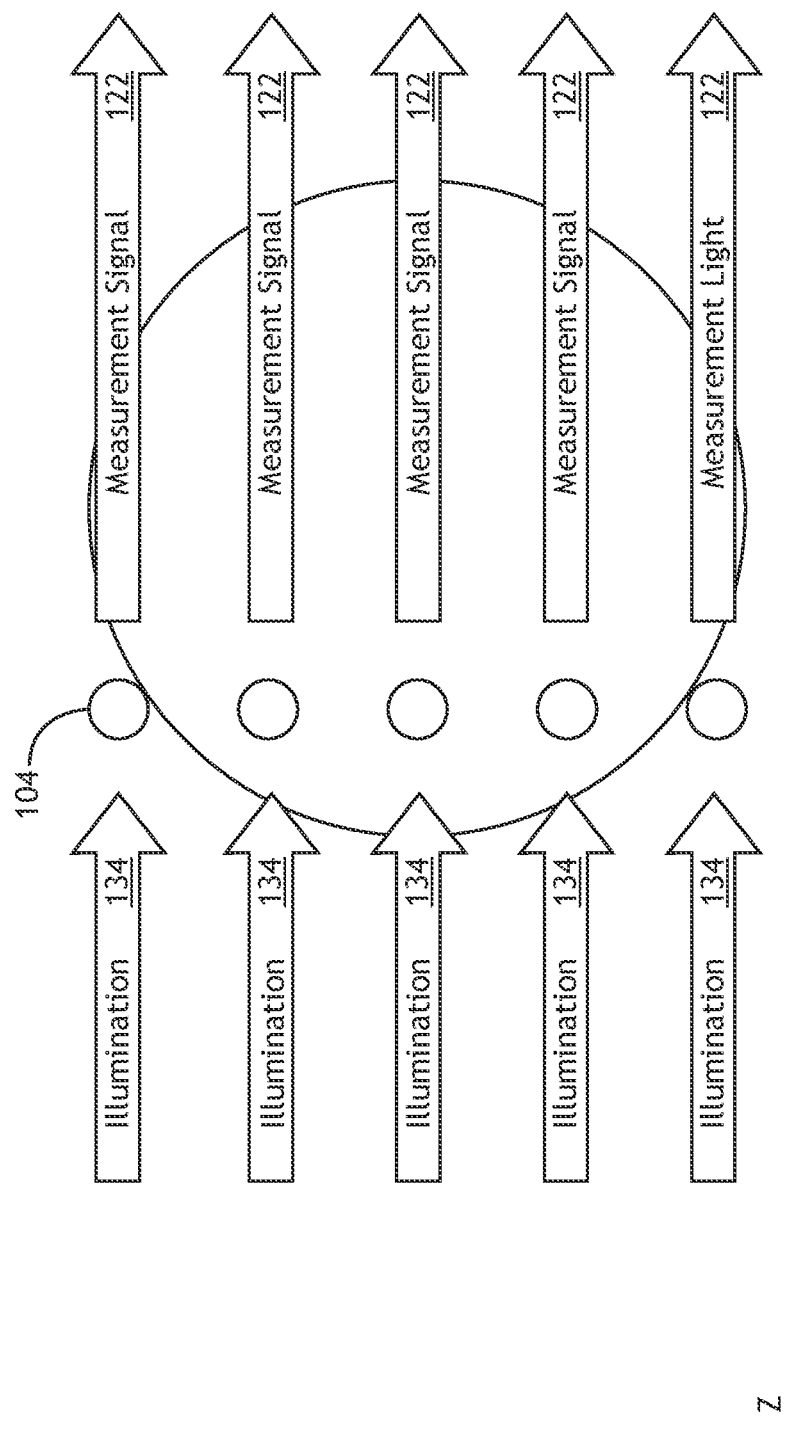
FIG. 2A is a conceptual view of a series of measurement columns distributed across a sample providing independent illumination and collection in accordance with one or more embodiments of the present disclosure.

In one embodiment, at least one of the measurement columns 104 includes a dedicated illumination source 106 and/or detector 110. Such a configuration may facilitate independent control and part usage for the measurement column 104. Further, the parameters associated with illumination and/or collection (e.g., wavelength, polarization, spectrum of the illumination 134 and/or measurement signals 122 directed to the detector 110, temporal properties of the illumination 134, integration time of the detector 110, or the like) may be independently controlled for the measurement column 104 without impacting other measurement columns 104. FIG. 2A is a conceptual view of a series of measurement columns 104 distributed across a sample 108 providing independent illumination and collection in accordance with one or more embodiments of the present disclosure. In FIG. 2A, each measurement column 104 receives illumination 134 from a separate illumination source 106 and directs measurement signals 122 from the sample 108 to a separate detector 110.

In another embodiment, two or more measurement columns 104 receive illumination 134 from a common illumination source 106. This configuration may decrease system complexity and/or cost in the case that an illumination source 106 provides sufficient output to drive multiple measurement columns 104. Further, as will be discussed in greater detail below, the illumination 134 from a common illumination source 106 may be, but is not required to be, multiplexed such that different measurement columns 104 receive illumination 134 with distinguishable parameters.

Figure 2B:
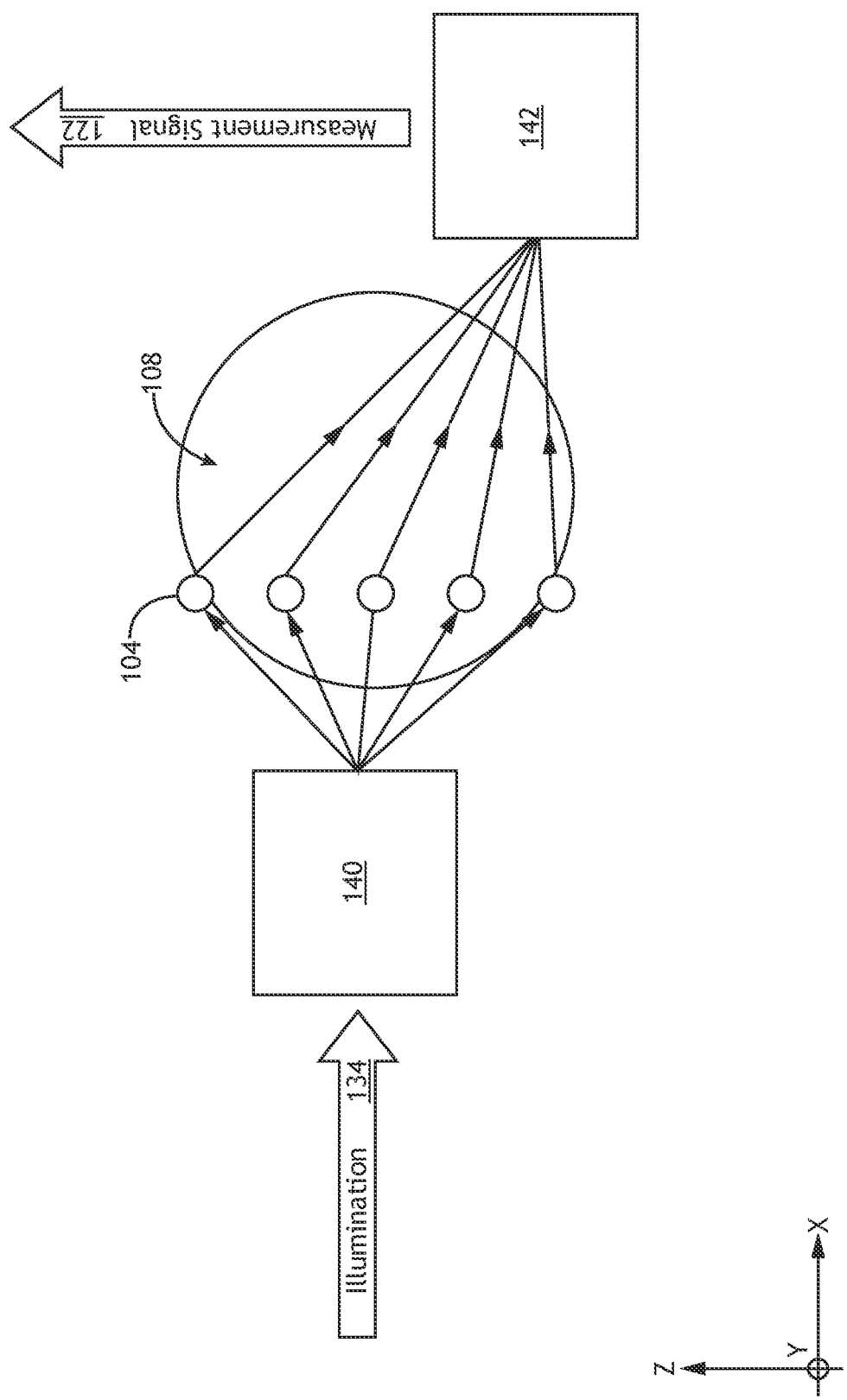
FIG. 2B is a conceptual view of a series of measurement columns distributed across a sample that share a common illumination source and a common detector in accordance with one or more embodiments of the present disclosure.

Similarly, measurement columns 104 may use dedicated or shared detectors 110. In one embodiment, each detector 110 receives measurement signals 122 from a separate measurement column 104. In another embodiment, a common detector 110 receives measurement signals 122 from two or more measurement columns 104. FIG. 2B is a conceptual view of a series of measurement columns 104 distributed across a sample 108 that share a common illumination source 106 and a common detector 110 in accordance with one or more embodiments of the present disclosure.

It is contemplated herein that detection of measurement signals 122 from multiple measurement columns 104 may require multiplexing/demultiplexing of the measurement signals 122 based on one or more distinguishable optical characteristics of the measurement signals 122 such as, but not limited to, wavelength, polarization, or temporal characteristics (e.g., relative temporal delays between measurement signals 122 from the measurement columns 104). Accordingly, the measurement signals 122 from the various measurement columns 104 may be distinguishable by the detector 110 and the detector 110 may generate separate detection signals associated with each of the measurement columns 104. In one embodiment, the overlay metrology system 100 includes one or more components to direct the measurement signals 122 from different measurement columns 104 to different portions of the detector 110. For example, the measurement signals 122 from the various measurement columns 104 may be directed along separate paths to different portions of the detector 110. By way of another example, in the case where measurement signals 122 are multiplexed based on wavelength, the detector 110 may include a diffractive element (e.g., a prism, a diffraction grating, or the like) to physically separate the measurement signals 122 from different measurement columns 104 on the detector 110. In another embodiment, in the case where measurement signals 122 are multiplexed based on temporal characteristics (e.g., based on delay lines, or the like), the measurement signals 122 from the various measurement columns 104 may be directed to a common portion of the detector 110 and differentiated based on time.

In one embodiment, the generation of multiplexed measurement signals 122 is implemented at least in part by multiplexing the illumination provided to the various measurement columns 104. In this way, the measurement signals 122 from the various measurement columns 104 may be multiplexed in a similar manner. Further, the illumination provided to the various measurement columns 104 may be multiplexed using multiple techniques. For example, in a configuration in which a measurement column 104 has a dedicated illumination source 106, this dedicated illumination source 106 may be configured to provide illumination parameters that are different than those in other measurement columns 104. By way of another example, components of the illumination sub-system 118 (e.g., the illumination-pathway control elements 126, the illumination-pathway focusing elements 124, or the like) of a measurement column 104 may be configured to provide selected illumination parameters that are different than those in other measurement columns 104.

Figure 3A:
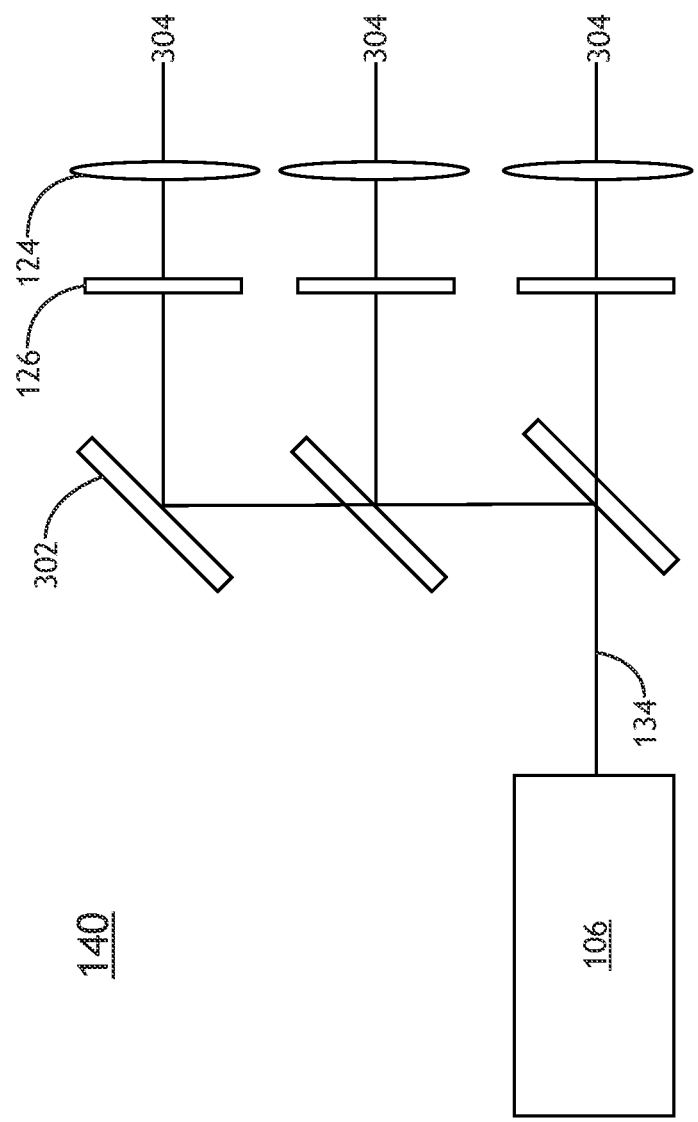
FIG. 3A is a conceptual view of an illumination multiplexer in accordance with one or more embodiments of the present disclosure.

By way of another example, in a configuration in which two or more measurement columns 104 receive illumination from a common illumination source 106, the overlay metrology system 100 may include an illumination multiplexer 140 to introduce differentiated illumination parameters to illumination directed to the various measurement columns 104. FIG. 3A is a conceptual view of an illumination multiplexer 140 in accordance with one or more embodiments of the present disclosure. In one embodiment, an illumination multiplexer 140 includes one or more beamsplitters 302 to split illumination 134 from an illumination source 106 into a selected number of paths 304, where light from each of the paths 304 is directed to a different measurement column 104 (e.g., along an illumination connection pathway 136). Further, the illumination multiplexer 140 may include illumination-pathway control elements 126 and/or illumination-pathway focusing elements 124 in any of the paths 304 to differentiate the illumination 134 directed to the various measurement columns 104. The illumination-pathway control elements 126 and/or illumination-pathway focusing elements 124 may be substantially the same as described with respect to the illumination sub-system 118 of a measurement column 104 and may include, but are not limited to, filters, stops, polarizers, temporal delay lines, or the like. In this regard, illumination multiplexing may occur external to a measurement column 104, within a measurement column 104, or through any combination of the two.

In another embodiment, the generation of multiplexed measurement signals 122 is implemented at least in part by multiplexing the measurement signals 122 from one or more measurement columns 104 directly. For example, the collection sub-system 120 of a measurement column 104 may differentiate the measurement signals 122 from that measurement column 104 with respect to the measurement signals 122 from other measurement columns 104. Multiplexing the measurement signals 122 may be particularly suitable for, but is not limited to, multiplexing based on polarization or temporal characteristics.

Figure 3B:
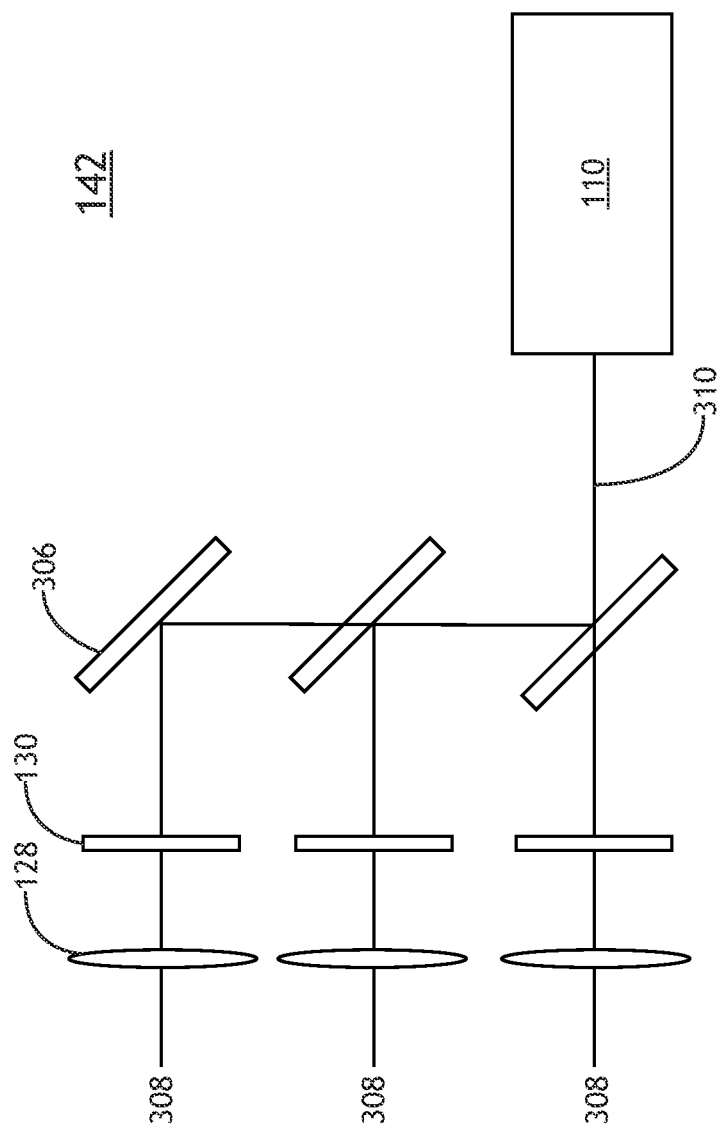
FIG. 3B is a conceptual view of a detection demultiplexer in accordance with one or more embodiments of the present disclosure.

FIG. 3B is a conceptual view of a detection demultiplexer 142 in accordance with one or more embodiments of the present disclosure. In one embodiment, a detection demultiplexer 142 includes one or more beam combiners 306 to collect measurement signals 122 from multiple paths 308 (e.g., from multiple detection connection pathways 138) into a common path 310 directed to the detector 110. In this way, the detector 110 may receive the measurement signals 122 from the various paths 308. Further, the detection demultiplexer 142 may include collection-pathway control elements 130 and/or collection-pathway focusing elements 128 along any of the paths 308 to provide that the measurement signals 122 from each of the measurement columns 104 is distinguishable by the detector 110.

It is to be understood, however, that the illustrations in FIGS. 3A and 3B, along with the associated descriptions, are provided solely for illustrative purposes and should not be interpreted as limiting. For example, FIGS. 3A and 3B depict the illumination-pathway focusing elements 124 and the collection-pathway focusing elements 128 as transmissive lenses used for optical wavelengths. However, it is to be understood that the concepts illustrated in FIGS. 3A and 3B may be applicable to any type or combination of measurement columns 104 including, but not limited to, x-ray measurement columns 104, EUV measurement columns 104, or particle-beam measurement columns 104. Accordingly, the illumination multiplexer 140 and/or the detection demultiplexer 142 may include any suitable components based on the illumination 134 and measurement signals 122 of interest.

Figure 4A:
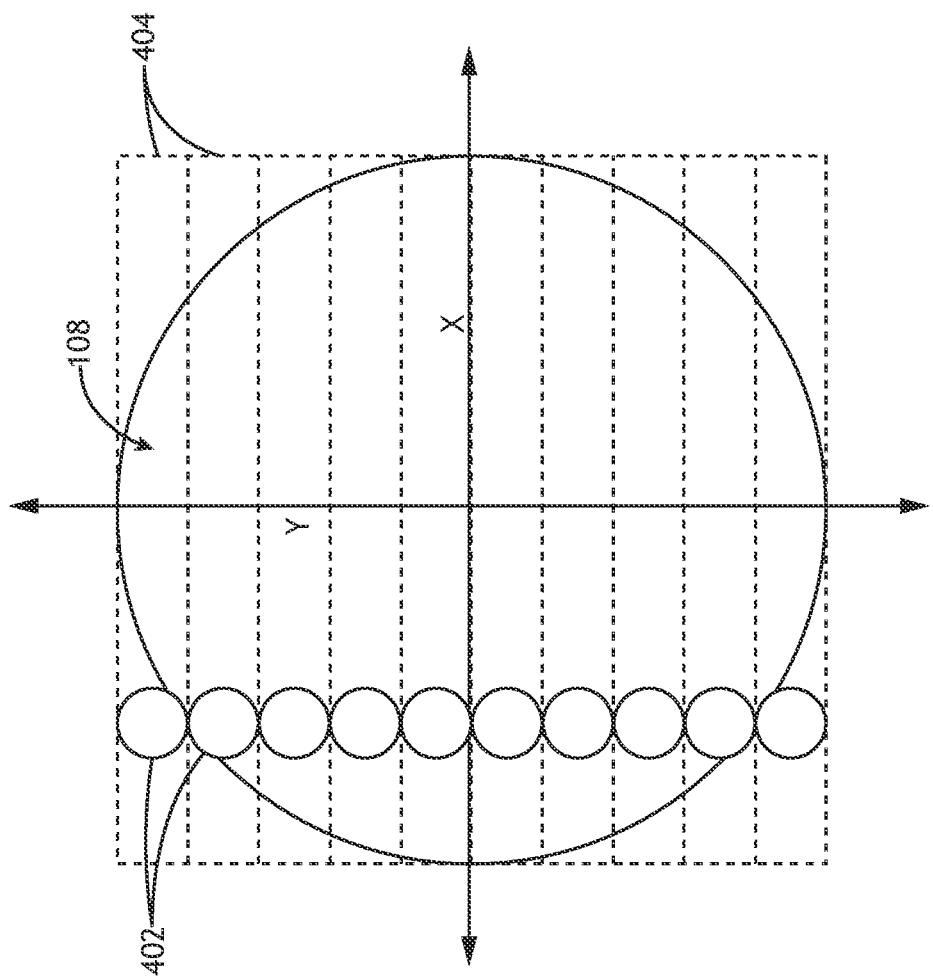
FIG. 4A is a conceptual view of an optical metrology system including a series of measurement columns 104 distributed along a column direction in accordance with one or more embodiments of the present disclosure.
Figure 4A:
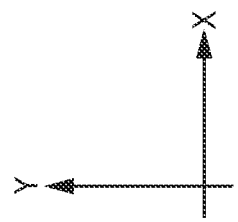
Figure 4B:
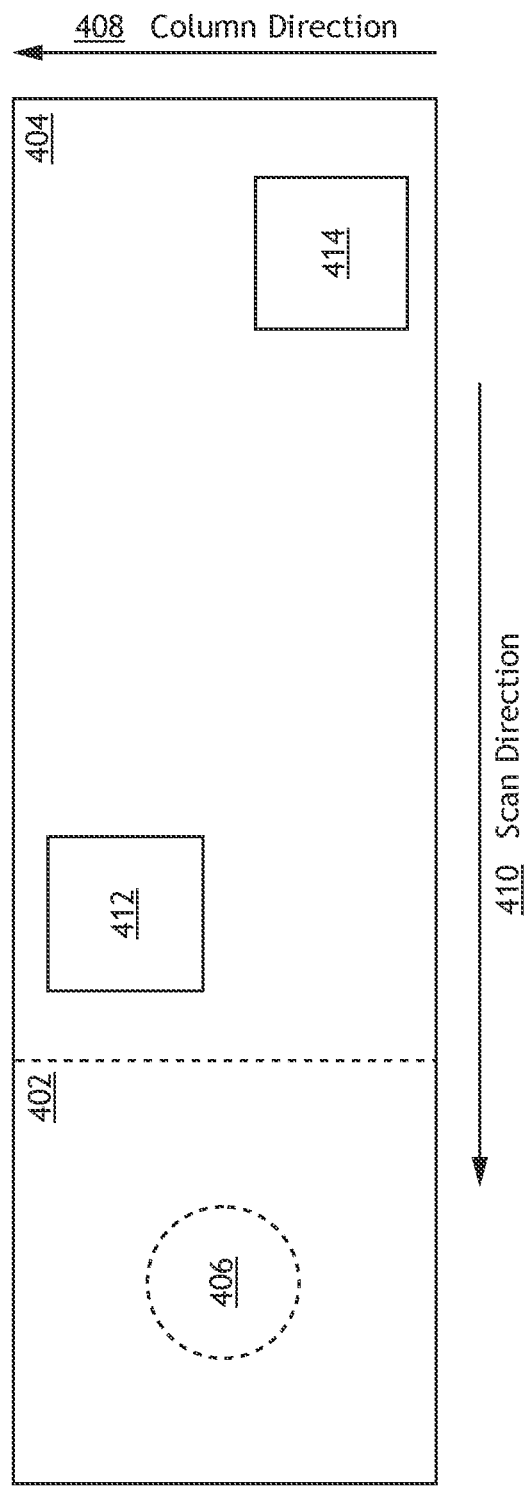
FIG. 4B is a conceptual view of a measurement swath on a sample including a nonlinear distribution of metrology targets in accordance with one or more embodiments of the present disclosure.

Referring now to FIGS. 4A-4B, various physical configurations of measurement columns 104 in an overlay metrology system 100 are described in greater detail in accordance with one or more embodiments of the present disclosure. It is contemplated herein that multiple measurement columns 104 may be distributed in a variety of patterns with respect to a sample 108. Further, different distribution patterns of the measurement columns 104 may be suitable for scanning-mode measurements, static-mode measurements, or selective switching between the two.

In one embodiment, two or more measurement columns 104 are distributed along a column direction. For example, the two or more measurement columns 104 may be distributed linearly along the column direction or along a curved path with at least a directional component along the column direction.

FIG. 4A is a conceptual view of an overlay metrology system 100 including a series of measurement columns 104 distributed along a column direction in accordance with one or more embodiments of the present disclosure. In FIG. 4A, the column direction corresponds to the Y direction.

In the distribution illustrated in FIG. 4A, each of the measurement columns 104 may have a measurement field 402 defined by a field of view of an associated collection sub-system 120 (e.g., a field of view of a collection lens 132 in the collection sub-system 120) and a range of motion of the associated column-positioning sub-system 112 (e.g., in the lateral X-Y plane illustrated in FIG. 4A). For example, the measurement fields 402 of each measurement column 104 are illustrated as a circle in FIG. 4A that may have a size defined by a radius of a field of view of a collection sub-system 120 (not shown), which is typically circular, and ranges of motion of a column-positioning sub-system 112 along the X and Y directions. However, a measurement field 402 may generally have any size or shape.

A measurement column 104 may perform a measurement on a metrology target within its measurement field by aligning the field of view of the collection sub-system 120 to the metrology target using the column-positioning sub-system 112. Further, an overlay metrology system 100 including distribution of measurement columns 104 along a column direction such as illustrated in FIG. 4A may measure multiple metrology targets distributed across a sample 108 by scanning the sample 108 along one or more scan paths different than the column direction to move various metrology targets on the sample 108 through measurement fields 402 of the measurement columns 104. For example, a scan path may include, but is not limited to, scanning along the X direction.

Further, a series of measurement swaths 404 may be defined that include areas on the sample 108 that are brought within the measurement fields 402 of the various measurement columns 104 as the sample 108 through the overlay metrology system 100 along a scan path. For example, FIG. 4A illustrates a series of parallel measurement swaths 404 along the X direction associated with scanning the sample 108 along the X direction.

FIG. 4B is a conceptual view of a measurement swath 404 on a sample 108 including a nonlinear distribution of metrology targets (or cells thereof) in accordance with one or more embodiments of the present disclosure. For example, FIG. 4B illustrates a starting position of a field of view 406 of a collection sub-system 120 approximately centered within the measurement swath 404 along the column direction 408, which is perpendicular to the scan direction 410. FIG. 4B further illustrates a first metrology target 412 at a first position along the column direction 408 and a second metrology target 414 at a second position along the column direction 408. In one embodiment, the column-positioning sub-system 112 (not shown) may sequentially adjust the field of view 406 of the collection sub-system 120 to align with the first metrology target 412 to provide for measurements of the first metrology target 412 and then adjust the field of view 406 of the collection sub-system 120 to align with the second metrology target 414 to provide for measurements of the second metrology target 414 as the sample 108 is scanned along the scan direction 410. Further, the measurements of the first metrology target 412 and the second metrology target 414 may be performed as the sample 108 is in motion along the scan direction 410 (e.g., in a scanning-mode) or as the sample 108 is stationary (e.g., in a static mode). In this regard, it is to be understood that descriptions of scanning the sample 108 are not limited to scanning-mode measurements, but more generally refers to moving the sample 108 to position selected metrology targets within measurement regions of the measurement columns 104.

Referring again to FIG. 4A, it is contemplated herein that the measurement columns 104 may be distributed along any length or spatial extent along the column direction and with any density. In this regard, the illustration in FIG. 4A is provided solely for illustrative purposes and should not be interpreted as limiting. For example, FIG. 4A illustrates a distribution of measurement columns 104 that spans a size of the sample 108 (e.g., an expected size of a sample 108 to be measured) such that metrology targets across the entire sample 108 may be characterized as the sample 108 is scanned. However, in some embodiments, the measurement columns 104 may span a length along the column direction that is larger than the sample 108 or smaller than the sample 108 (where multiple scans may be necessary to measure the entire sample 108).

By way of another example, FIG. 4A illustrates a distribution of measurement columns 104 arranged such that the measurement fields 402 provides complete coverage of the sample 108 along the column direction. In this regard, the entire sample 108 may be measured in a single scan. However, in some embodiments, the measurement columns 104 may be spread out along the column direction such that there are gaps between the measurement fields 402 along the column direction. In this regard, multiple scans may be required to measure the entire sample 108. In one embodiment, measurement columns 104 are arranged to correspond to scribe lines on the sample 108 that may include metrology targets. In this case, metrology targets in the scribe lines along the scan direction may be measured in a single scan even if there are gaps between the measurement fields 402 along the column direction.

In another embodiment, multiple measurement columns 104 are distributed in a two-dimensional pattern. In this regard, the measurement fields 402 associated with the measurement columns 104 may be distributed across a sample 108. Further, the column-positioning sub-system 112 of each measurement column 104 may adjust the position of the measurement column 104 to align a field of view of the collection sub-system 120 (e.g., a collection lens 132 in the collection sub-system 120) to any metrology target within the associated measurement field 402 for a measurement.

Figure 5:
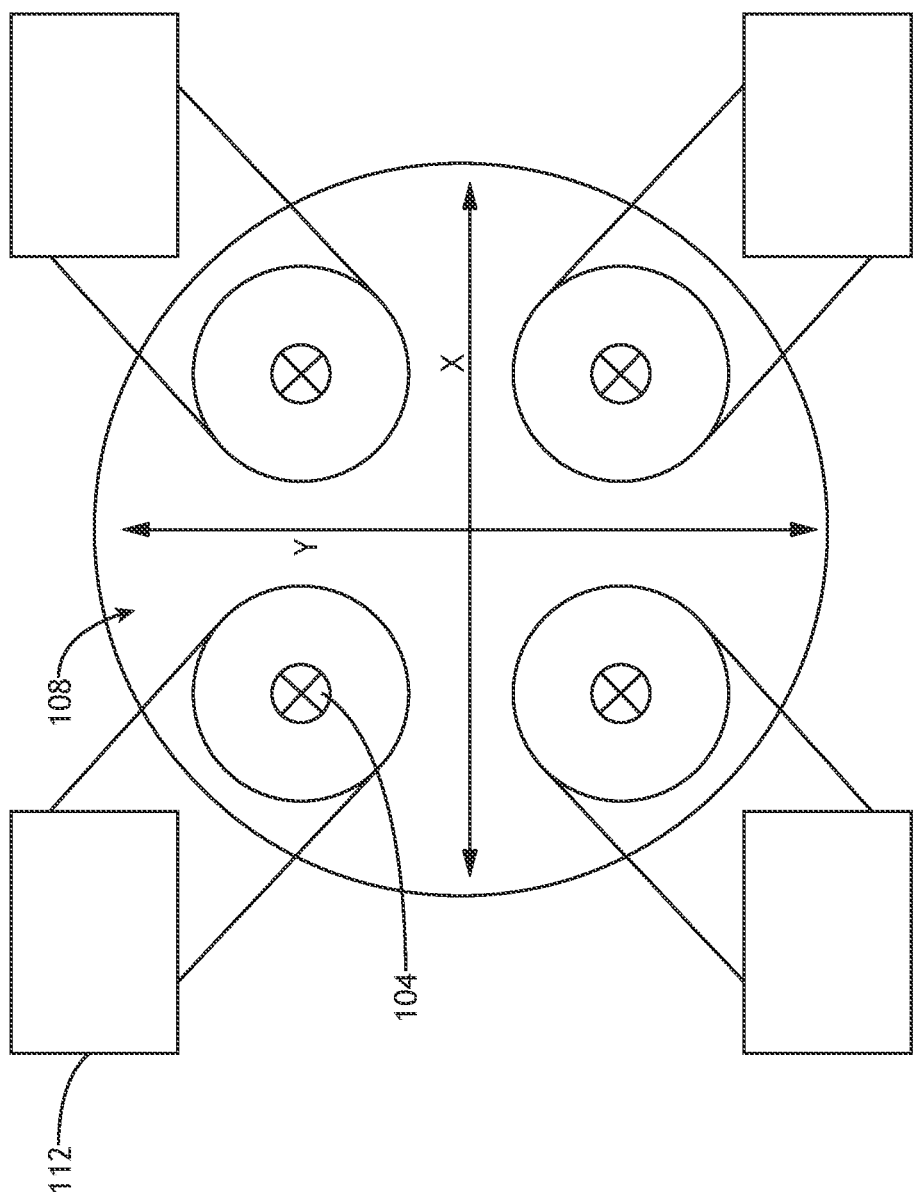
FIG. 5 is a conceptual view of an optical metrology system including a two-dimensional distribution of measurement columns in accordance with one or more embodiments of the present disclosure.

FIG. 5 is a conceptual view of an overlay metrology system 100 including a two-dimensional distribution of measurement columns 104 in accordance with one or more embodiments of the present disclosure. For example, FIG. 5 illustrates a configuration of the overlay metrology system 100 with four measurement columns 104, where each measurement column 104 has measurement fields 402 spanning a quarter of the sample 108. For instance, in the case of a sample 108 with a 300 mm diameter (e.g., corresponding to one standard size of a semiconductor wafer), the column-positioning sub-system 112 for each measurement column 104 may provide approximately 150 mm of travel in both X and Y directions. Further, FIG. 5 illustrates the column-positioning sub-system 112 associated with each measurement column 104.

It is contemplated herein that the measurement columns 104 may be distributed to provide any selected distribution or density of measurement fields 402. In one embodiment, the measurement fields 402 of the measurement columns 104 may correspond to angular sections of a sample 108 (e.g., with respect to a central point). In another embodiment, the measurement fields 402 of the measurement columns 104 may be distributed in a two-dimensional array or grid pattern.

Further, FIG. 5 illustrates a configuration in which the measurement fields 402 cover the entire sample 108 such that the entire sample 108 can be measured without requiring translation of the sample 108. In some embodiments, the overlay metrology system 100 is configured to provide gaps between at least some of the measurement fields 402 such that a complete measurement of the sample 108 may be provided by translating the sample 108. In this regard, the required range of each column-positioning sub-system 112 may be reduced to facilitate faster and/or more accurate measurements of metrology targets within the associated measurement field 402.

Referring again to FIG. 1A, in one embodiment, the overlay metrology system 100 includes a controller 144 communicatively coupled to the multi-column overlay metrology tool 102 and/or any components therein. In another embodiment, the controller 144 includes one or more processors 146. For example, the one or more processors 146 may be configured to execute a set of program instructions maintained in a memory device 148, or memory. The one or more processors 146 of a controller 144 may include any processing element known in the art. In this sense, the one or more processors 146 may include any microprocessor-type device configured to execute algorithms and/or instructions.

The one or more processors 146 of a controller 144 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 146 may include any device configured to execute algorithms and/or instructions (e.g., program instructions stored in memory). In one embodiment, the one or more processors 146 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 144 may include one or more controllers housed in a common housing or within multiple housings. In this way, any controller or combination of controllers may be separately packaged as a module suitable for integration into overlay metrology system 100.

The memory device 148 may include any storage medium known in the art suitable for storing program instructions executable by the associated one or more processors 146. For example, the memory device 148 may include a non-transitory memory medium. By way of another example, the memory device 148 may include, but is not limited to, a read-only memory (ROM), a random-access memory (RAM), a magnetic or optical memory device (e.g., disk), a magnetic tape, a solid-state drive and the like. It is further noted that the memory device 148 may be housed in a common controller housing with the one or more processors 146. In one embodiment, the memory device 148 may be located remotely with respect to the physical location of the one or more processors 146 and the controller 144. For instance, the one or more processors 146 of the controller 144 may access a remote memory (e.g., server), accessible through a network (e.g., internet, intranet and the like).

In this way, the controller 144 may direct (e.g., through control signals) or receive data from the multi-column overlay metrology tool 102 or any components therein. The controller 144 may further be configured to perform any of the various process steps described throughout the present disclosure such as, but not limited to, directing the column-positioning sub-system 112 to adjust a position of a measurement column 104, directing the sample-positioning sub-system 114 to adjust a position of the sample 108, or receiving detection signals from one or more detectors 110 associated with metrology measurements, generating overlay measurements based on detection signals from the detectors 110, generating correctables for one or more additional tools based on the overlay measurements, or calibrating at least one measurement column 104 with overlay measurements from at least one additional measurement column 104.

In another embodiment, the overlay metrology system 100 includes a user interface 150 communicatively coupled to the controller 144. In one embodiment, the user interface 150 may include, but is not limited to, one or more desktops, laptops, tablets, and the like. In another embodiment, the user interface 150 includes a display used to display data of the overlay metrology system 100 to a user. The display of the user interface 150 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 150 is suitable for implementation in the present disclosure. In another embodiment, a user may input selections and/or instructions responsive to data displayed to the user via a user input device of the user interface 150.

Figure 6:
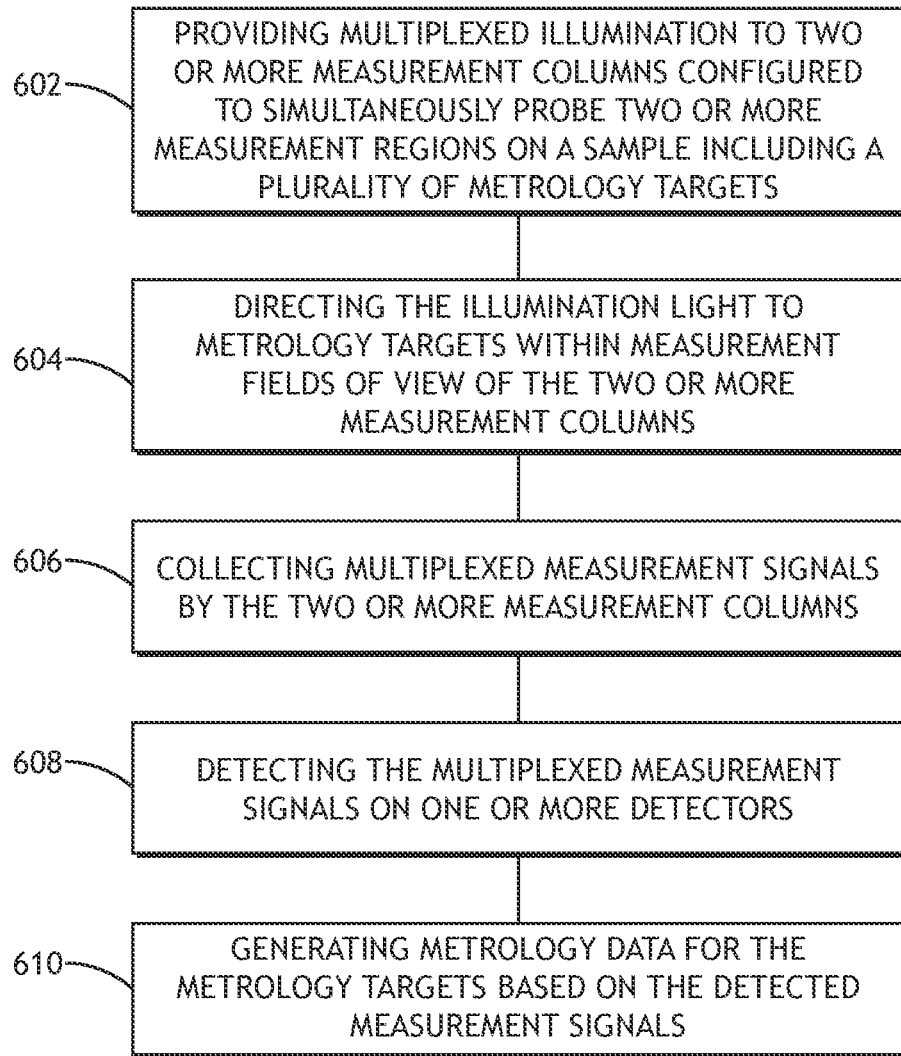
FIG. 6 is a flow diagram illustrating steps performed in a method for optical metrology in accordance with one or more embodiments of the present disclosure.

FIG. 6 is a flow diagram illustrating steps performed in a method 600 for multi-column metrology in accordance with one or more embodiments of the present disclosure. Applicant notes that the embodiments and enabling technologies described previously herein in the context of the overlay metrology system 100 should be interpreted to extend to the method 600. It is further noted, however, that the method 600 is not limited to the architecture of the overlay metrology system 100.

In one embodiment, the method 600 includes a step 602 of providing multiplexed illumination to two or more measurement columns configured to simultaneously probe two or more measurement regions on a sample including a plurality of metrology targets. For example, a particular measurement column may include an illumination sub-system to direct illumination from at least one of one or more illumination sources to the sample, a collection sub-system including a collection lens configured to collect measurement signals from the sample and direct the measurement signals to one or more detectors, and a column-positioning sub-system configured to adjust a position of the collection lens within a lateral plane parallel to a sample plane for a measurement, where a measurement region of the particular measurement column is defined by a field of view of the collection lens and a range of the positioning system in the lateral plane.

In another embodiment, the method 600 includes a step 604 of directing the illumination light to metrology targets within measurement fields of view of the two or more measurement columns. In another embodiment, the method 600 includes a step 606 of collecting multiplexed measurement signals by the two or more measurement columns. For example, the measurement signals may be multiplexed based on any of one or more parameters including, but not limited to, wavelength, polarization, or time characteristics. Further, the measurement signals may be multiplexed in a variety of ways. In one instance, the measurement signals may be multiplexed after a measurement (e.g., via one or more polarizers, one or more delay lines, or the like). In another instance, the illumination light directed to the two or more measurement columns is multiplexed such that the measurement signals are similarly multiplexed. In another embodiment, the method 600 includes a step 608 of detecting the multiplexed measurement signals on one or more detectors. In another embodiment, the method 600 includes a step 610 of generating metrology data for the metrology targets based on the detected measurement signals. For example, the metrology data may include, but is not limited to, overlay metrology data.

Figure 7:
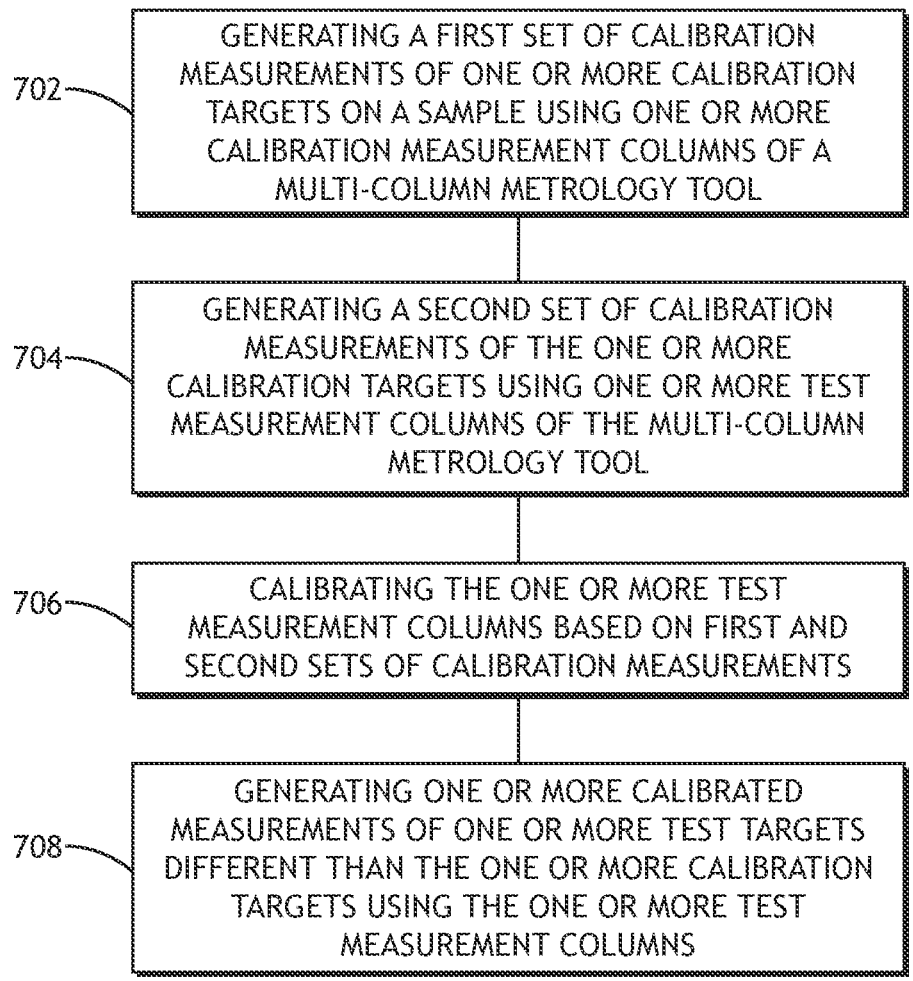
FIG. 7 is a flow diagram illustrating steps performed in a method 700 for self-calibration of a multi-column metrology tool in accordance with one or more embodiments of the present disclosure.

FIG. 7 is a flow diagram illustrating steps performed in a method 700 for self-calibration of a multi-column metrology tool in accordance with one or more embodiments of the present disclosure. Applicant notes that the embodiments and enabling technologies described previously herein in the context of the overlay metrology system 100 should be interpreted to extend to the method 700. It is further noted, however, that the method 700 is not limited to the architecture of the overlay metrology system 100.

It is contemplated herein that a multi-column metrology tool such as, but not limited to the multi-column overlay metrology tool 102, that includes at least two measurement columns 104 having different measurement accuracies (or other characteristics) may provide self-calibrated metrology data. In particular, metrology data from one measurement column 104 may be used to calibrate and/or train another measurement column 104. For example, it may be the case that measurement columns 104 that utilize different types of illumination sources 106 may naturally exhibit different measurement characteristics such as accuracy or throughput. For example, measurement columns 104 based on x-ray, EUV, or particle-beam illumination 134 may often (but not necessarily always) provide higher measurement accuracy than measurement columns 104 based on visible or IR illumination 134, but with a lower throughput. However, higher-throughput measurement columns 104 may be calibrated to provide improved accuracy using metrology data from higher-accuracy measurement columns 104.

In one embodiment, the method 700 includes a step 702 of generating a first set of calibration measurements of one or more calibration targets on a sample using one or more calibration measurement columns of a multi-column metrology tool. In another embodiment, the method 700 includes a step 704 of generating a second set of calibration measurements of the one or more calibration targets using one or more test measurement columns of the multi-column metrology tool. For example, the one or more test measurement columns may provide different measurement accuracies than the one or more calibration columns, where the different measurement accuracies may be, but are not required to be, a result of the use of different illumination sources 106.

It is to be understood, however, that the terms "test measurement columns" and "calibration measurement columns" are used herein for illustrative purposes and should not be interpreted as limiting. Rather, any or all measurement columns 104 may be utilized for any desired purpose including run-time measurements, calibration of other measurement columns 104, or a combination thereof. In this way, the terms "test measurement columns" and "calibration measurement columns" are used herein for clarity to refer to different subsets of measurement columns 104 when used for self-calibration.

In another embodiment, the method 700 includes a step 706 of calibrating the one or more test measurement columns based on first and second sets of calibration measurements. In another embodiment, the method 700 includes a step 708 of generating one or more calibrated measurements of one or more test targets different than the one or more calibration targets using the one or more test measurement columns.

The step 706 of calibrating the one or more test measurement columns may be implemented using various techniques. In one embodiment, the step 706 includes identifying correlations or patterns between metrology measurements generated by both the test and calibration measurement columns and then training the test measurement columns (or a controller 144 connected to any of the measurement columns) to generate metrology data based on the correlations. In this way, the test measurement columns (or a controller connected to any of the test measurement columns) may generate calibrated metrology data for new test metrology targets using a combination of the measurement signals acquired by the test measurement columns and the correlations identified in step 706. Further, this calibrated metrology may have a higher accuracy than uncalibrated metrology data from the test measurement columns and may further be generated at the throughput of the test measurement columns.

The step 706 may involve a number of algorithms. For example, a metrology target may be modeled (parameterized) using any technique known in the art including, but not limited to, a geometric engine, a process modeling engine, or a combination thereof. The use of process modeling is generally described in U.S. patent Ser. No. 10/769,320 issued on Sep. 8, 2020, which is incorporated herein by reference in its entirety. A geometric engine may be implemented, but is not required to be implemented, by AcuShape software, a product provided by KLA Corp. By way of another example, interaction of an illumination beam with a metrology target on a sample may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis.

The step 706 may further include analysis of collected metrology data from the test or calibration measurement columns using any data fitting and optimization technique known in the art to apply the collected data to the model including, but not limited to libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), and/or sparse representation of data (e.g., Fourier or wavelet transforms, Kalman filters, algorithms to promote matching from same or different tool types, and the like). For example, data collection and/or fitting may be, but is not required to be, performed by Signal Response Metrology (SRM), a product provided by KLA Corp.

Further, the various implementations of algorithms may be, but are not required to be, performed by a controller (e.g., the controller 144) through firmware, software, or field-programmable gate arrays (FPGAs), or one or more other programmable optical elements.

Once a model is trained in step 706, the step 708 may include implementing the model to provide calibrated metrology data based on new metrology measurements of new metrology targets with the test measurement columns. The step 708 may incorporate any data fitting or optimization technique known in the art to apply collected metrology data from the new metrology targets to the model. Continuing the examples provided for step 706, this may include, but is not limited to, library searches, regression analyses, implementation of machine-learning algorithms, support-vector machines (SVM), dimensionality-reduction algorithms, or the like. For example, data collection and/or fitting may be, but is not required to be, performed by Signal Response Metrology (SRM) by KLA Corp.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A multi-column metrology tool comprising:
   two or more measurement columns distributed along a column direction, wherein the two or more measurement columns are configured to simultaneously probe two or more measurement regions on a sample including a plurality of metrology targets, wherein the two or more measurement regions are distributed along the column direction with gaps therebetween, wherein a particular measurement column of the two or more measurement columns comprises:
- an illumination sub-system including one or more lenses configured to direct illumination from at least one of one or more illumination sources to the sample; and
- a collection sub-system including a collection lens configured to collect measurement signals from the sample and direct the measurement signals to one or more detectors; and
- a sample-positioning sub-system including one or more actuators configured to scan the sample along two or more scan paths along directions different than the column direction, wherein each of the two or more scan paths positions metrology targets of the plurality of metrology targets within the two or more measurement regions of the two or more measurement columns for measurements, wherein the sample is moved along the column direction between the two or more scan paths to provide coverage of at least some of the gaps between the two or more measurement regions.

2. The multi-column metrology tool of claim 1, wherein at least one of the two or more measurement columns collects the measurement signals from two or more measurement planes and directs the measurement signals from the two or more measurement planes to at least one of the one or more detectors.

3. The multi-column metrology tool of claim 1, wherein the sample-positioning sub-system is further configured to adjust a position of the sample along an axial direction normal to a plane of the sample.

4. The multi-column metrology tool of claim 1, wherein the sample-positioning sub-system includes a rotation stage to rotate the sample.

5. The multi-column metrology tool of claim 1, wherein at least one of the one or more detectors comprise moveable detectors located on at least one of the two or more measurement columns.

6. The multi-column metrology tool of claim 1, wherein at least one of the one or more illumination sources comprise moveable illumination sources located on at least one of the two or more measurement columns.

7. The multi-column metrology tool of claim 1, wherein at least one of the one or more illumination sources comprises an electromagnetic illumination source.

8. The multi-column metrology tool of claim 1, wherein at least one of the one or more illumination sources comprises a particle-beam illumination source.

9. The multi-column metrology tool of claim 1, wherein at least one of the two or more measurement columns is configured to perform a measurement on at least one of the plurality of metrology targets as the sample is moving along the two or more scan paths.

10. The multi-column metrology tool of claim 1, wherein at least one of the two or more measurement columns is configured to perform the measurements as the sample is stationary.

11. The multi-column metrology tool of claim 1, wherein the two or more scan paths are linear, wherein at least some of the plurality of metrology targets are linearly arranged to be measured by at least some of the two or more measurement columns as the sample is scanned along the two or more scan paths.

12. The multi-column metrology tool of claim 1, wherein a spatial extent of the two or more measurement columns along the column direction corresponds to a size of a desired measurement area on the sample.

13. The multi-column metrology tool of claim 1, wherein sizes of measurement areas of the one or more detectors along the column direction sum to at least 10% of a size of the sample along the column direction.

14. The multi-column metrology tool of claim 1, wherein the collection lens comprises:
an objective lens.

15. The multi-column metrology tool of claim 1, wherein the metrology targets comprise:
dedicated metrology targets.

16. The multi-column metrology tool of claim 1, wherein the metrology targets comprise:
device features on the sample.

17. The multi-column metrology tool of claim 1, wherein the metrology targets are formed from at least one of after-development features, after-etch features, or after-cleaning features.

18. The multi-column metrology tool of claim 1, wherein at least one of the one or more illumination sources comprises a fixed illumination source located external to the two or more measurement columns.

19. The multi-column metrology tool of claim 18, wherein at least two of the two or more measurement columns receive the illumination from the fixed illumination source.

20. The multi-column metrology tool of claim 18, wherein at least one of the two or more measurement columns receives the illumination from the fixed illumination source through one or more optical fibers.

21. The multi-column metrology tool of claim 1, wherein at least one of the one or more detectors comprises a fixed detector located external to the two or more measurement columns.

22. The multi-column metrology tool of claim 21, wherein the measurement signals provided by at least two of the two or more measurement columns are multiplexed by one or more parameters.

23. The multi-column metrology tool of claim 22, wherein the one or more parameters comprise:
at least one of polarization, wavelength, or time.

24. The multi-column metrology tool of claim 22, wherein the fixed detector provides separate detector data associated with the measurement signals provided by the at least two of the two or more measurement columns that are multiplexed by the one or more parameters.

25. The multi-column metrology tool of claim 22, further comprising:
- a detection demultiplexer configured to receive the measurement signals from the at least two of the two or more measurement columns and generate two or more demultiplexed measurement signals, wherein the detection demultiplexer further distributes the two or more demultiplexed measurement signals to the fixed detector.

26. The multi-column metrology tool of claim 22, wherein the illumination received by the at least two of the two or more measurement columns is multiplexed by the one or more parameters.

27. The multi-column metrology tool of claim 21, wherein at least one of the two or more measurement columns directs the measurement signals through one or more optical fibers.

28. A multi-column metrology method comprising:
providing illumination to two or more measurement columns, wherein the two or more measurement columns are configured to simultaneously probe two or more measurement regions on a sample including a plurality of metrology targets as the sample is scanned along two or more scan paths, wherein the two or more measurement regions are distributed along a column direction with gaps therebetween, wherein the sample is moved along the column direction between the two or more scan paths to provide coverage of at least some of the gaps, wherein the two or more scan paths are along directions different than the column direction, wherein a particular measurement column of the two or more measurement columns comprises:
- an illumination sub-system including one or more lenses configured to direct the illumination from at least one of one or more illumination sources to the sample; and
- a collection sub-system including a collection lens configured to collect measurement signals from the sample and direct the measurement signals to one or more detectors;

directing the illumination to the plurality of metrology targets within measurement fields of view of the two or more measurement columns;

collecting the measurement signals by the two or more measurement columns;

detecting the measurement signals on the one or more detectors; and generating metrology data for the plurality of metrology targets within the measurement fields of view of the two or more measurement columns based on the measurement signals.

29. The multi-column metrology method of claim 28, wherein the measurement signals provided by at least two of the two or more measurement columns are multiplexed by one or more parameters.

30. The multi-column metrology method of claim 29, wherein the measurement signals provided by at least two of the two or more measurement columns are multiplexed by at least one of polarization, wavelength, or time.

31. A multi-column metrology method comprising:
generating a first set of calibration measurements of one or more calibration targets on a sample using one or more calibration measurement columns of a multi-column metrology tool;
generating a second set of calibration measurements of the one or more calibration targets using one or more test measurement columns of the multi-column metrology tool, wherein the one or more test measurement columns provide different measurement accuracies than the one or more calibration measurement columns, wherein a particular calibration measurement column of the one or more calibration measurement columns or a particular test measurement column of the one or more test measurement columns comprises:
- an illumination sub-system including one or more lenses configured to direct illumination from at least one of one or more illumination sources to the sample;
- a collection sub-system including a collection lens configured to collect measurement signals from the sample and direct the measurement signals to one or more detectors; and
- a column-positioning sub-system including one or more actuators configured to adjust a position of the collection lens within a lateral plane parallel to a sample plane for a measurement, wherein a measurement region is defined by a field of view of the collection lens and a range of the column-positioning sub-system in the lateral plane;

calibrating the one or more test measurement columns based on first and second sets of calibration measurements; and generating one or more calibrated measurements of one or more test targets different than the one or more calibration targets using the one or more test measurement columns.

32. The multi-column metrology method of claim 31, wherein the one or more illumination sources comprise:
two or more illumination sources, wherein the one or more test measurement columns and the one or more calibration measurement columns receive the measurement signals from different illumination sources of the two or more illumination sources.

33. The multi-column metrology method of claim 31, wherein calibrating the one or more test measurement columns based on the first and second sets of calibration measurements comprises:
identifying correlations between the first and second sets of calibration measurements for the one or more test targets; and
training the one or more test measurement columns to generate metrology measurements based on the correlations.

* * * * *